(12) United States Patent
Mehouachi

(10) Patent No.: US 12,039,236 B1
(45) Date of Patent: Jul. 16, 2024

(54) METHODS, SYSTEMS, APPARATUSES, AND DEVICES FOR FACILITATING WAVE-BASED INVERSION USING TIME-DOMAIN SIFRIAN INVERSION (TDSI)

(71) Applicant: Fares Mehouachi, Gaafour (TN)

(72) Inventor: Fares Mehouachi, Gaafour (TN)

(*) Notice: Subject to any disclaimer, the term of this patent is extended or adjusted under 35 U.S.C. 154(b) by 0 days.

(21) Appl. No.: 18/506,736

(22) Filed: Nov. 10, 2023

(51) Int. Cl.
*G06F 30/20* (2020.01)

(52) U.S. Cl.
CPC .................. *G06F 30/20* (2020.01)

(58) Field of Classification Search
CPC ....................................... G06F 30/20
USPC ...................................... 345/419
See application file for complete search history.

(56) References Cited

U.S. PATENT DOCUMENTS

| | | |
|---|---|---|
| 11,551,416 B1 | 1/2023 | Mehouachi et al. |
| 2017/0097428 A1* | 4/2017 | Sun ............. G01V 1/303 |
| 2018/0095450 A1* | 4/2018 | Lappas ............ B33Y 30/00 |

OTHER PUBLICATIONS

Mehouachi, Fares B., ("Exact Stochastic Second Order Deep Learning" Apr. 9, 2021) (Year: 2021).*

* cited by examiner

*Primary Examiner* — Thomas J Lett

(57) ABSTRACT

A method for facilitating wave-based inversion using Time-Domain Sifrian Inversion (TDSI). The method includes receiving, using a communication device, observed data from a device. The method includes obtaining, using a processing device, an initial model. The method includes obtaining, using the processing device, synthetic data from the initial model. The method includes determining, using the processing device, a matching of the synthetic data with the observed data is not within a matching threshold. The method includes updating, using the processing device, the initial model using the TDSI iteratively until the matching threshold for the matching is achieved. The TDSI provides an update for the updating of the initial model iteratively using a time-domain cost function which is robust to a cycle skipping. The method includes generating, using the processing device, a final model based on the updating. The method includes storing, using a storage device, the final model.

20 Claims, 11 Drawing Sheets
(2 of 11 Drawing Sheet(s) Filed in Color)

METHODS, SYSTEMS, APPARATUSES, AND DEVICES FOR FACILITATING WAVE-BASED INVERSION USING TIME-DOMAIN SIFRIAN INVERSION (TDSI)

FIELD OF THE INVENTION

Generally, the present disclosure relates to the field of data processing. The present disclosure pertains to the domain of Partial Differential Equation (PDE)-constrained optimization, with a special focus on wave phenomena optimization. More specifically, the present disclosure relates to methods, systems, apparatuses, and devices for facilitating wave-based inversion using Time-Domain Sifrian Inversion (TDSI).

BACKGROUND OF THE INVENTION

Waveform imaging techniques hold a pivotal role in a variety of sectors, including but not limited to healthcare, construction, and resource exploration. These techniques are designed to construct high-resolution models of investigated mediums, such as geological formations or human tissues, based on the principles of wave propagation. The core of this process is essentially an optimization problem. The primary objective is to minimize the discrepancy between the observed data, and the synthetic data, generated through computational models. While first-order optimization methods like gradient descent are prevalent, second-order methods offer the advantage of faster convergence rates. However, these second-order methods come with their own set of computational challenges, particularly the complexities associated with handling the Hessian matrix.

One of the most significant challenges in waveform imaging is the phenomenon known as cycle skipping. This is caused by the oscillatory nature of waves and can lead to minimal mismatches between observed and synthetic data, even when the waveforms are out of phase. Also, an inversion that offers second-order optimization in waveform imaging and employs a functional which may be a zero-valued functional that allows for the efficient incorporation of second-order derivative information into the optimization process, effectively bypassing the computational burden associated with the Hessian matrix grapples with the issue of cycle skipping, especially when low-frequency components are not adequately present.

At the heart of waveform imaging, there are optimization techniques. While gradient descent methods are commonly used for model refinement, second-order methods offer the promise of faster convergence. However, these methods are computationally demanding due to the sheer size and complexity of the Hessian matrix. Furthermore, existing methods like BFGS and Hessian-free approaches for optimization have huge computation drawbacks.

Therefore, there is a need for improved methods, systems, apparatuses, and devices for facilitating wave-based inversion using Time-Domain Sifrian Inversion (TDSI) that may overcome one or more of the above-mentioned problems and/or limitations.

SUMMARY OF THE INVENTION

This summary is provided to introduce a selection of concepts in a simplified form, that are further described below in the Detailed Description. This summary is not intended to identify key features or essential features of the claimed subject matter. Nor is this summary intended to be used to limit the claimed subject matter's scope.

Disclosed herein is a method for facilitating wave-based inversion using Time-Domain Sifrian Inversion (TDSI), in accordance with some embodiments. Accordingly, the method may include a step of receiving, using a communication device, at least one observed data associated with at least one object from at least one device. Further, the method may include a step of obtaining, using a processing device, at least one initial model associated with the at least one object. Further, the method may include a step of obtaining, using the processing device, at least one synthetic data from the at least one initial model. Further, the method may include a step of determining, using the processing device, a matching of the at least one synthetic data with the at least one observed data is not within a matching threshold. Further, the method may include a step of updating, using the processing device, the at least one initial model using the Time-Domain Sifrian Inversion (TDSI) iteratively until the matching threshold for the matching may be achieved. Further, the Time-Domain Sifrian Inversion (TDSI) provides an update for the updating of the at least one initial model iteratively using at least one time-domain cost function. Further, the at least one time-domain cost function may be robust to a cycle skipping. Further, the method may include a step of generating, using the processing device, at least one final model based on the updating. Further, the method may include a step of storing, using a storage device, the at least one final model.

Further disclosed herein is a system for facilitating wave-based inversion using Time-Domain Sifrian Inversion (TDSI), in accordance with some embodiments. Further, the system may include a communication device, a processing device, and a storage device. Further, the communication device may be configured for receiving at least one observed data associated with at least one object from at least one device. Further, the processing device may be communicatively coupled with the communication device. Further, the processing device may be configured for obtaining at least one initial model associated with the at least one object. Further, the processing device may be configured for obtaining at least one synthetic data from the at least one initial model. Further, the processing device may be configured for determining a matching of the at least one synthetic data with the at least one observed data is not within a matching threshold. Further, the processing device may be configured for updating the at least one initial model using the Time-Domain Sifrian Inversion (TDSI) iteratively until the matching threshold for the matching may be achieved. Further, the Time-Domain Sifrian Inversion (TDSI) provides an update for the updating of the at least one initial model iteratively using at least one time-domain cost function. Further, the at least one time-domain cost function may be robust to a cycle skipping. Further, the processing device may be configured for generating at least one final model based on the updating. Further, the storage device may be communicatively coupled with the processing device. Further, the storage device may be configured for storing the at least one final model.

Both the foregoing summary and the following detailed description provide examples and are explanatory only. Accordingly, the foregoing summary and the following detailed description should not be considered to be restrictive. Further, features or variations may be provided in addition to those set forth herein. For example, embodiments may be directed to various feature combinations and sub-combinations described in the detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, which are incorporated in and constitute a part of this disclosure, illustrate various embodiments of the present disclosure. The drawings contain representations of various trademarks and copyrights owned by the Applicants. In addition, the drawings may contain other marks owned by third parties and are being used for illustrative purposes only. All rights to various trademarks and copyrights represented herein, except those belonging to their respective owners, are vested in and the property of the applicants. The applicants retain and reserve all rights in their trademarks and copyrights included herein, and grant permission to reproduce the material only in connection with reproduction of the granted patent and for no other purpose.

Furthermore, the drawings may contain text or captions that may explain certain embodiments of the present disclosure. This text is included for illustrative, non-limiting, explanatory purposes of certain embodiments detailed in the present disclosure.

Figure 1:
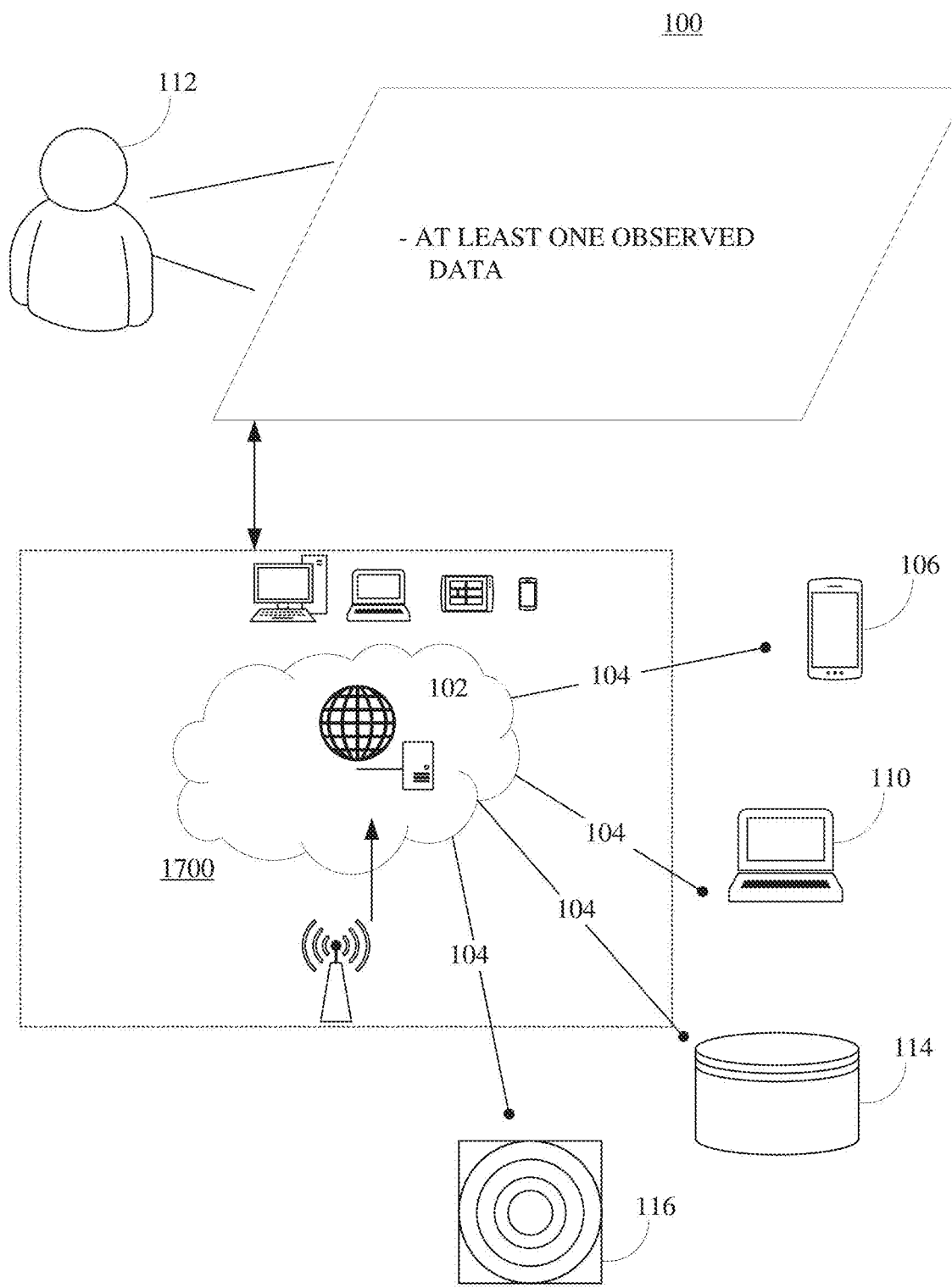

FIG. 1 is an illustration of an online platform consistent with various embodiments of the present disclosure.

Figure 2:
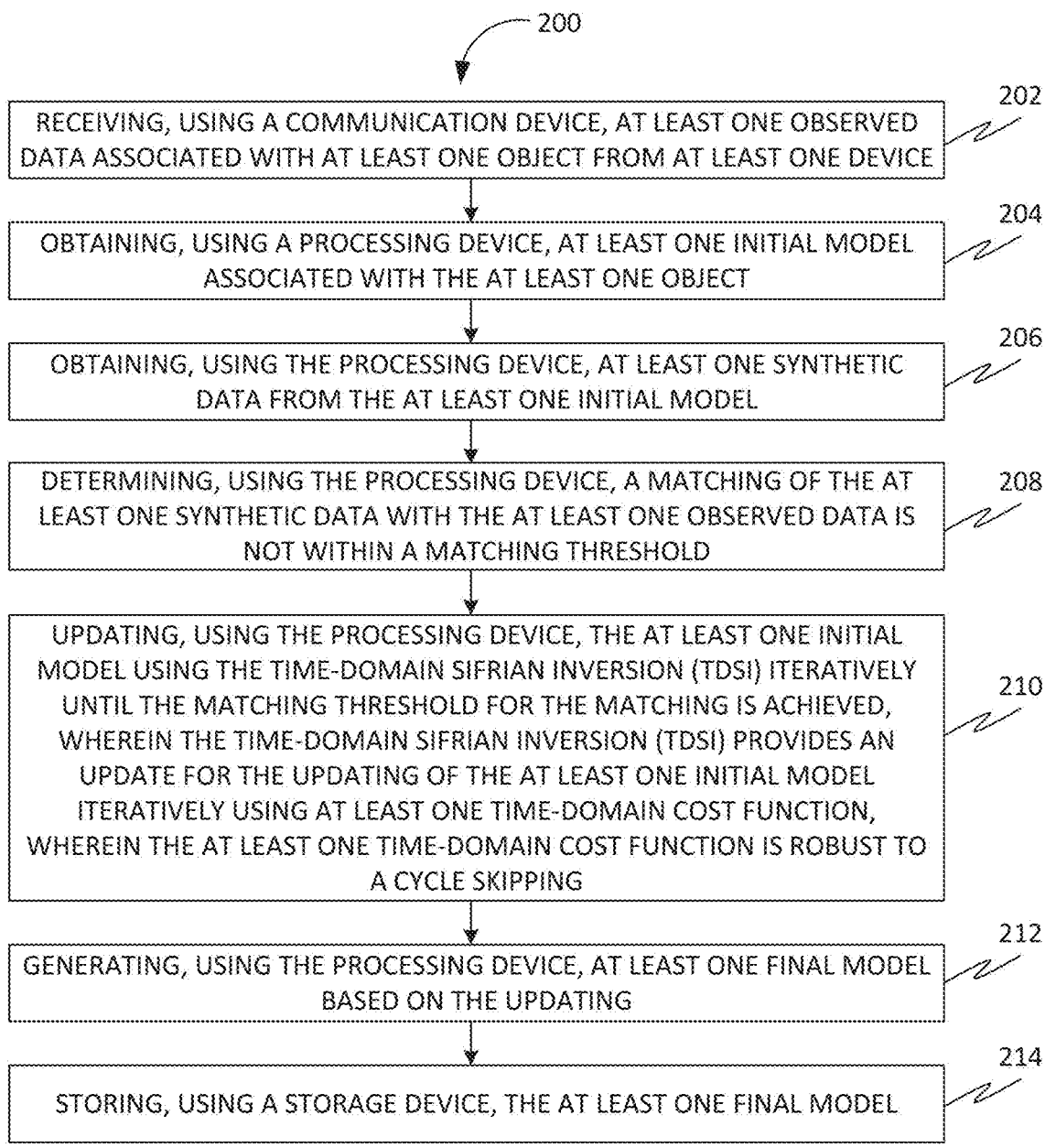

FIG. 2 is a flowchart of a method 200 for facilitating wave-based inversion using Time-Domain Sifrian Inversion (TDSI), in accordance with some embodiments.

Figure 3:
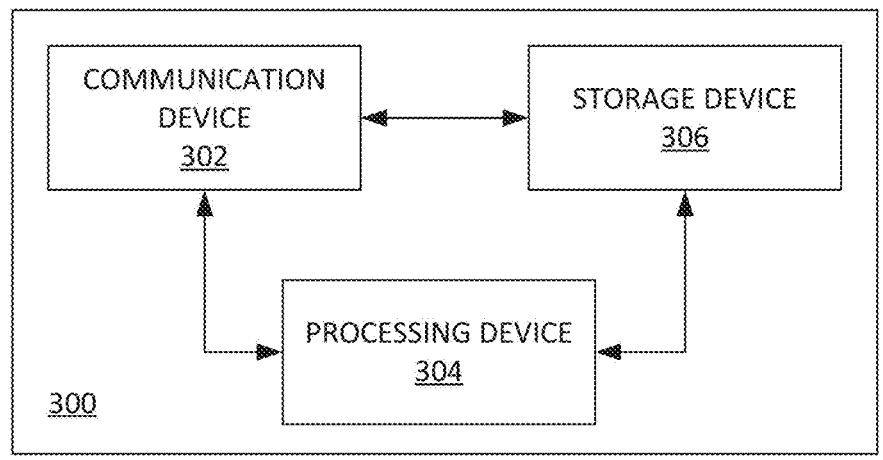

FIG. 3 is a block diagram of a system 300 for facilitating wave-based inversion using Time-Domain Sifrian Inversion (TDSI), in accordance with some embodiments.

Figure 4:
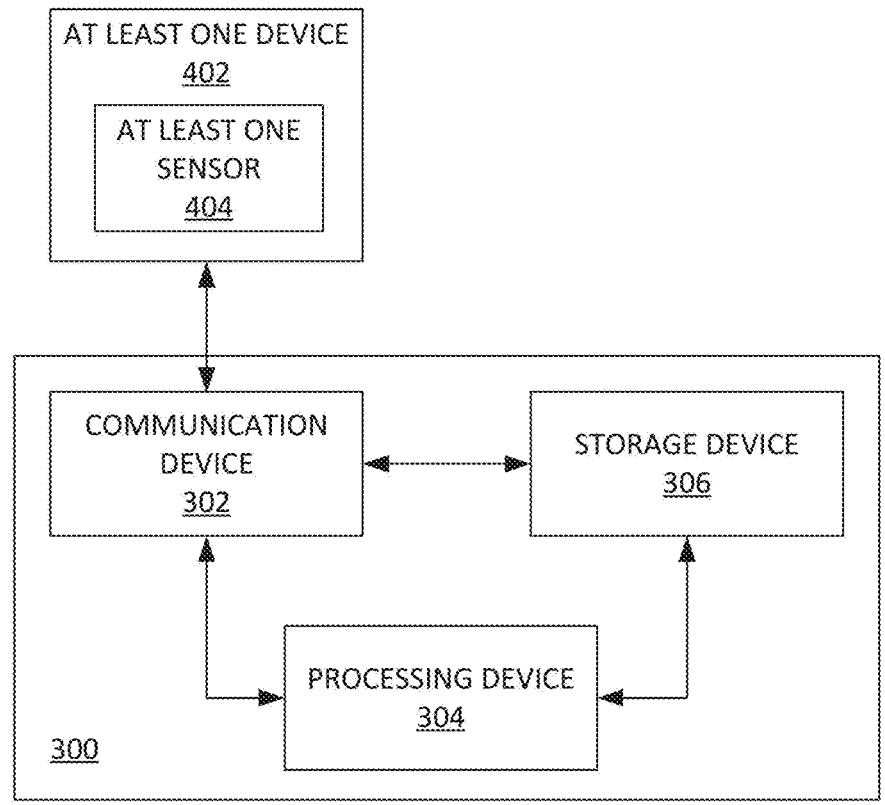

FIG. 4 is a block diagram of the system 300, in accordance with some embodiments.

Figure 5:
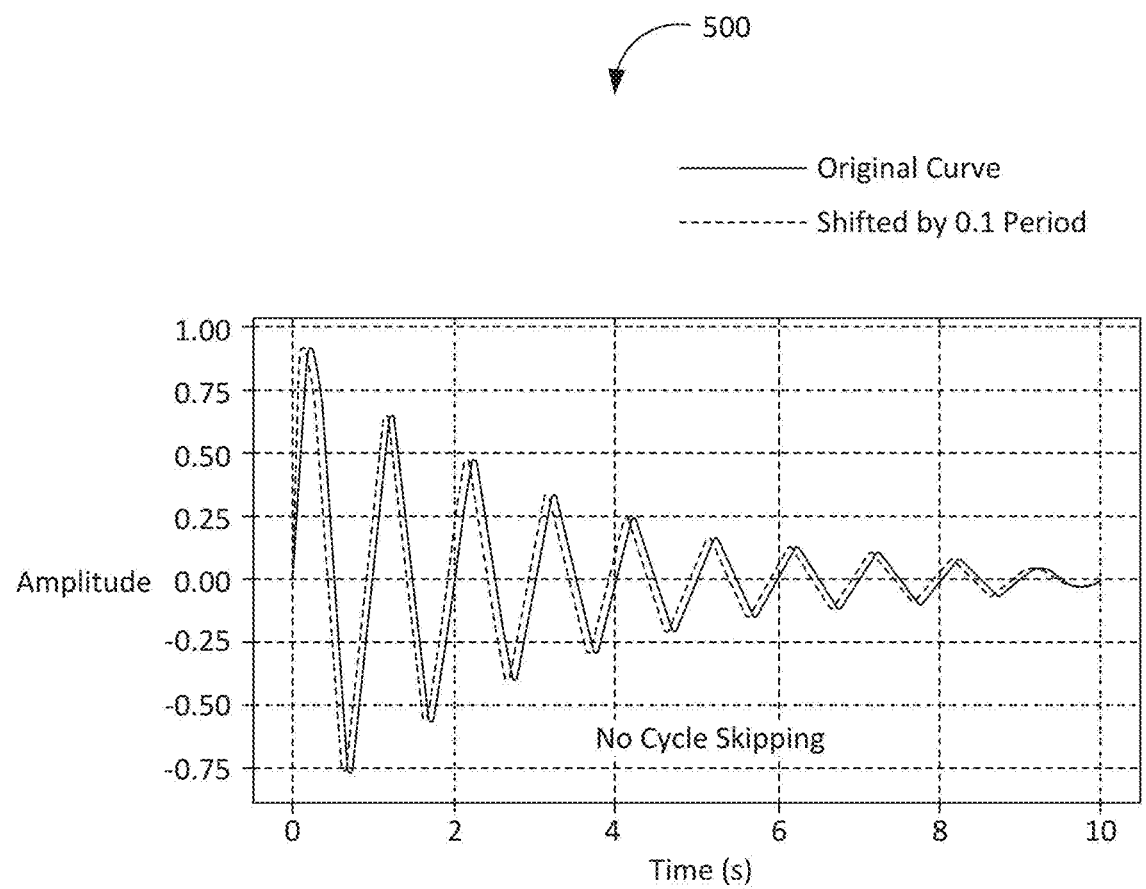

FIG. 5 is a graph 500 representing cycle skipping using two oscillatory signals, in accordance with some embodiments.

Figure 6:
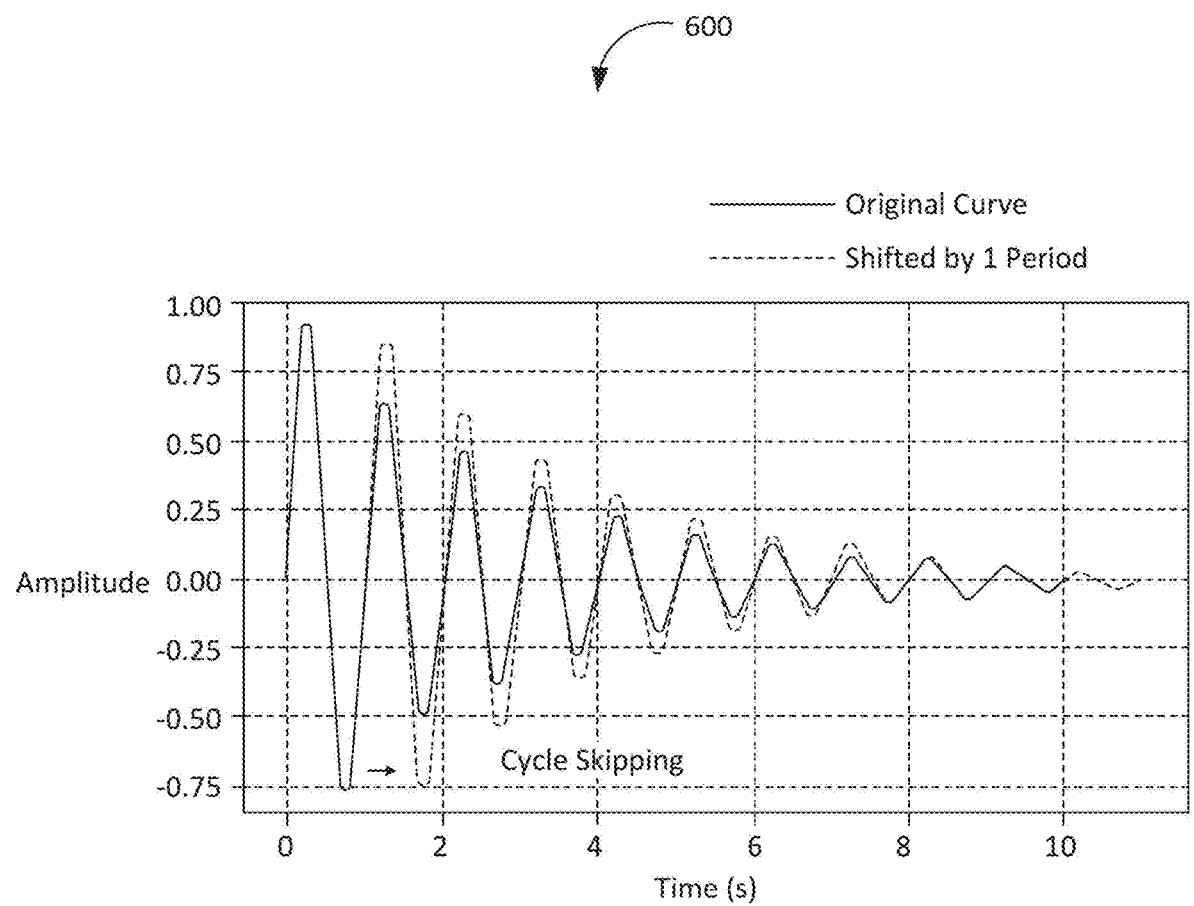

FIG. 6 is a graph 600 representing the cycle skipping using the two oscillatory signals, in accordance with some embodiments.

Figure 7:
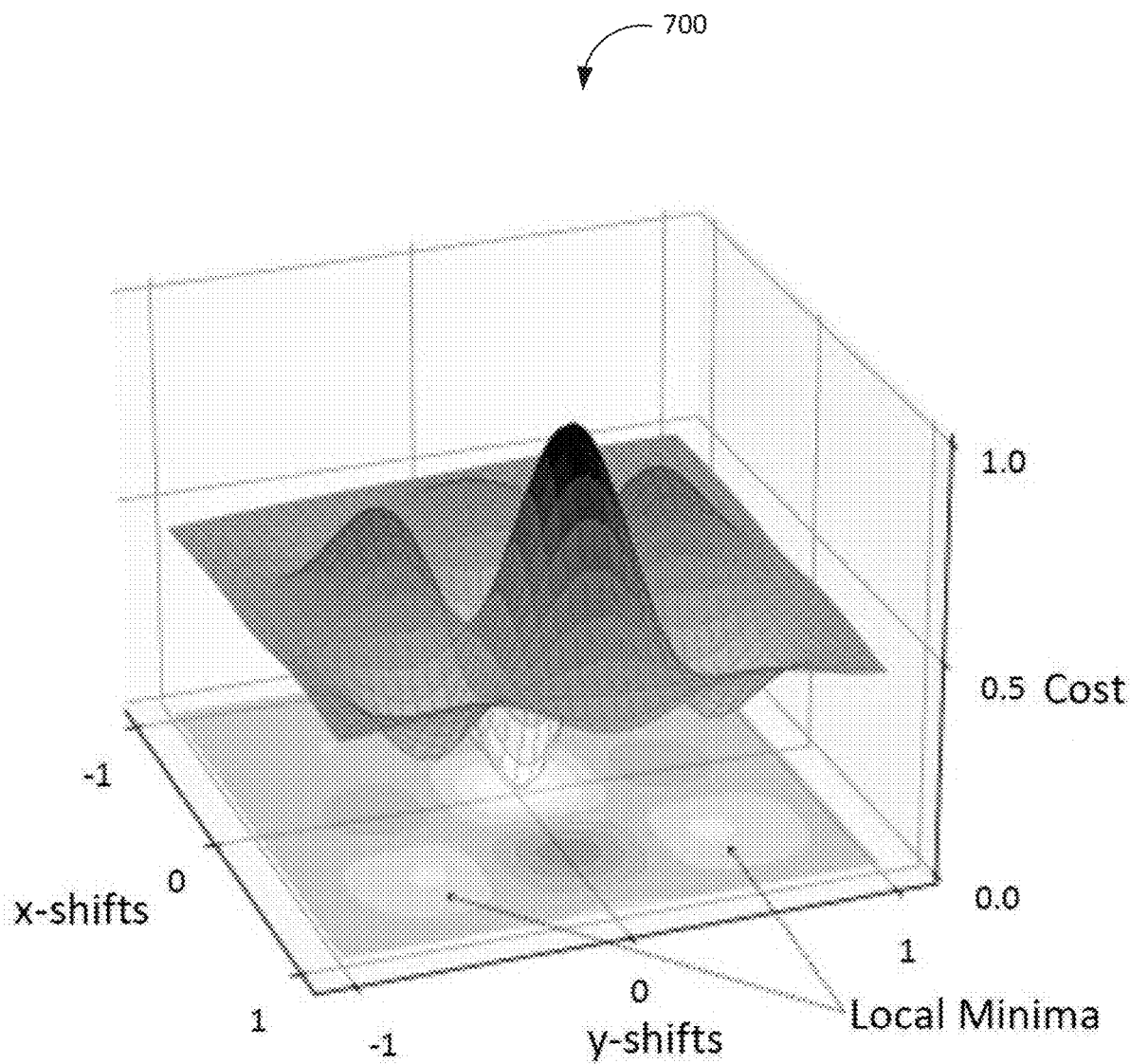

FIG. 7 is a graph 700 representing a cost function landscape of a cost function in a context of cycle skipping, in accordance with some embodiments.

Figure 8:
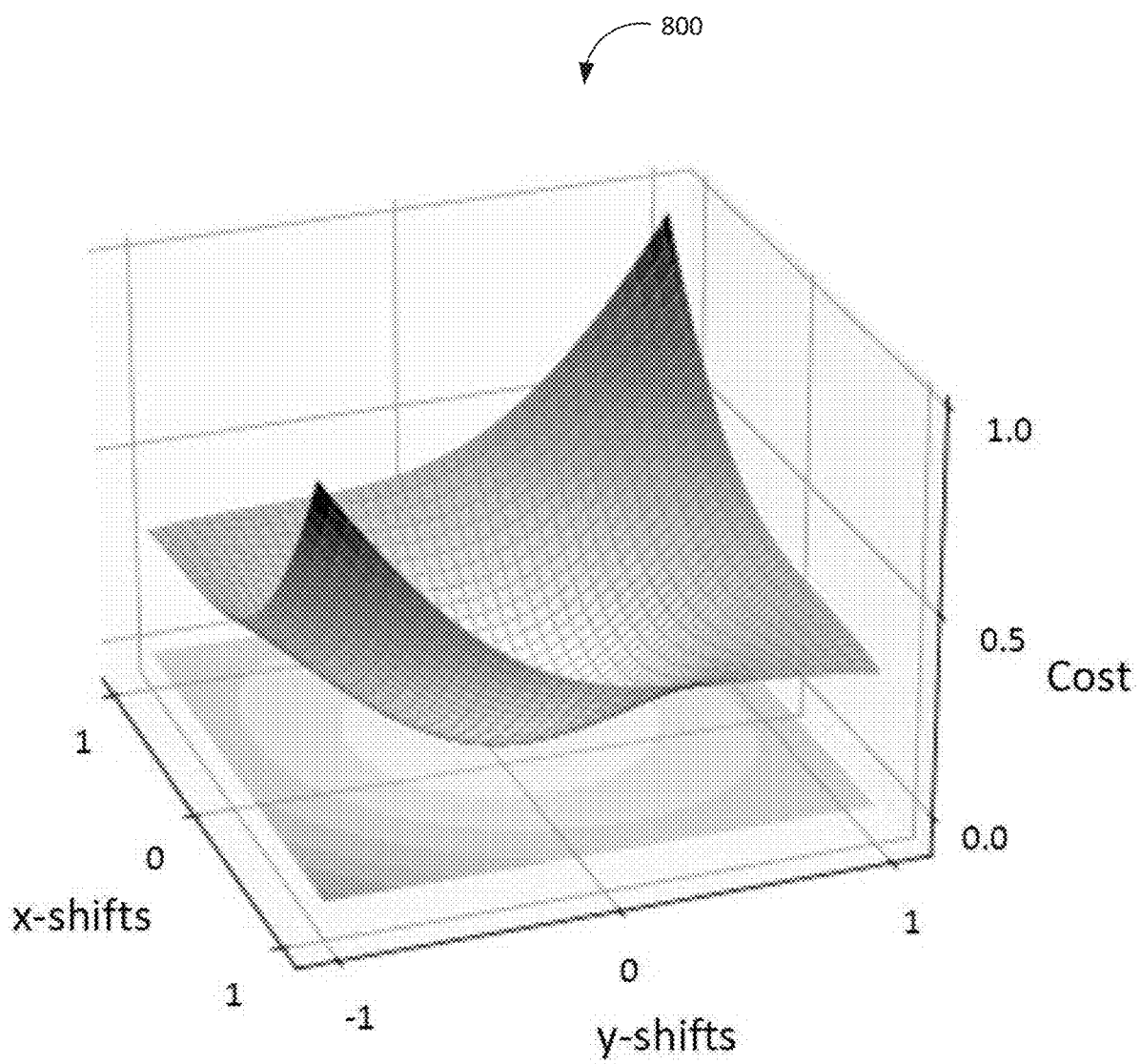

FIG. 8 is a graph 800 representing a cost function landscape of a cost function in a context of the cycle skipping, in accordance with some embodiments.

Figure 9:
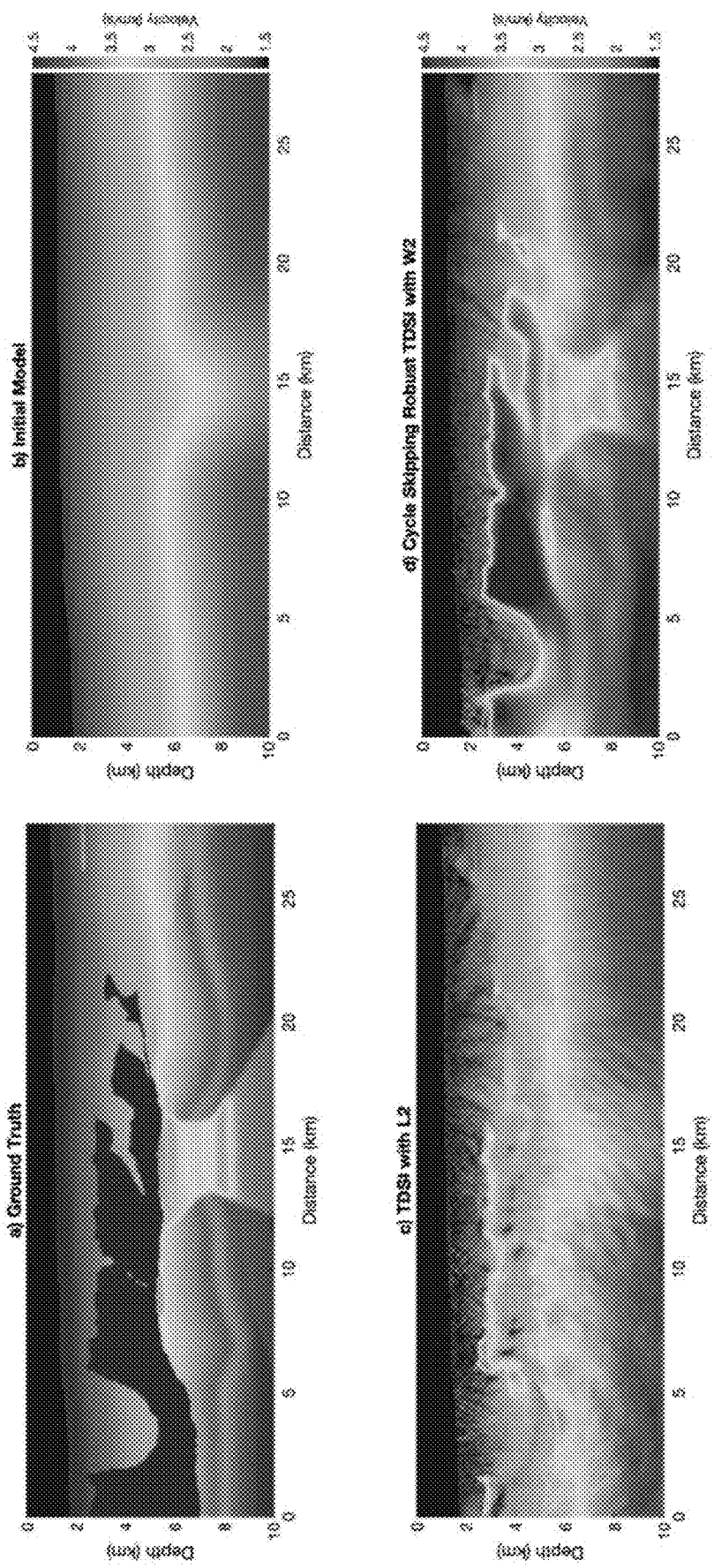

FIG. 9A illustrates a reference model used for evaluating an efficacy of Time-Domain Sifrian Inversion (TDSI) on a BP2004 Salt Model, in accordance with some embodiments.

FIG. 9B illustrates an initial model used for the evaluating of the efficacy of the Time-Domain Sifrian Inversion (TDSI) on the BP2004 Salt Model, in accordance with some embodiments.

FIG. 9C illustrates an outcome model that is obtained after performing the TDSI with L2 norm using a traditional distance measure, used for the evaluating of the efficacy of the Time-Domain Sifrian Inversion (TDSI) on the BP2004 Salt Model, in accordance with some embodiments.

FIG. 9D illustrates an outcome model that is obtained after performing Cycle-Skipping Robust TDSI employing squared Wasserstein distance W2, used for the evaluating of the efficacy of the Time-Domain Sifrian Inversion (TDSI) on the BP2004 Salt Model, in accordance with some embodiments.

Figure 10:
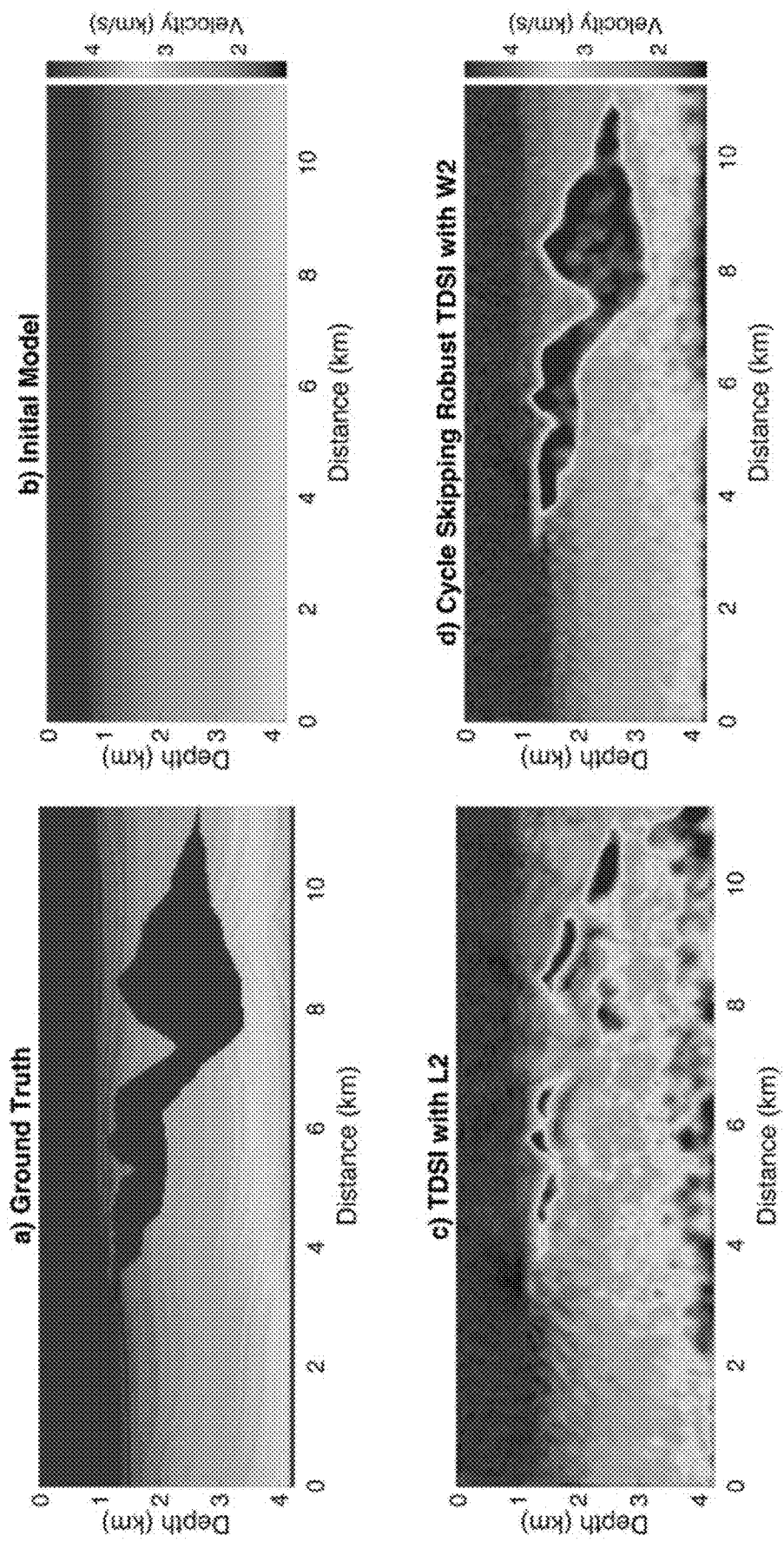

FIG. 10A illustrates a reference model used for evaluating an efficacy of Time-Domain Sifrian Inversion (TDSI) on a Sigsbee salt model, in accordance with some embodiments.

FIG. 10B illustrates an initial model used for the evaluating of the efficacy of the Time-Domain Sifrian Inversion (TDSI) on the Sigsbee salt model, in accordance with some embodiments.

FIG. 10C illustrates an outcome model that is obtained after performing the TDSI with L2 norm using a traditional distance measure, used for the evaluating of the efficacy of the Time-Domain Sifrian Inversion (TDSI) on the Sigsbee salt model, in accordance with some embodiments.

FIG. 10D illustrates an outcome model that is obtained after performing Cycle-Skipping Robust TDSI employing squared Wasserstein distance W2, used for the evaluating of the efficacy of the Time-Domain Sifrian Inversion (TDSI) on the Sigsbee salt model, in accordance with some embodiments.

Figure 11:
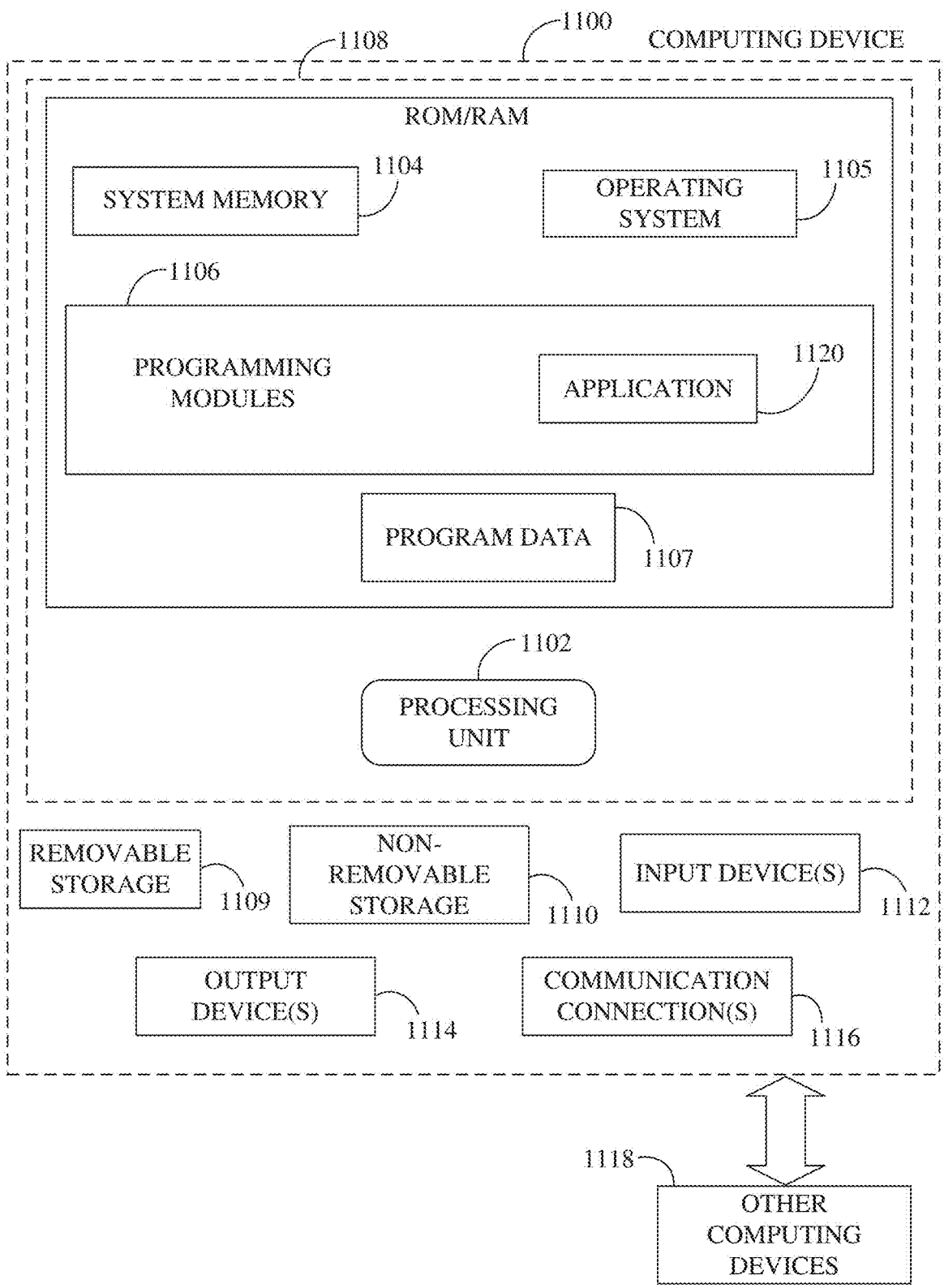

FIG. 11 is a block diagram of a computing device for implementing the methods disclosed herein, in accordance with some embodiments.

DETAILED DESCRIPTION OF THE INVENTION

As a preliminary matter, it will readily be understood by one having ordinary skill in the relevant art that the present disclosure has broad utility and application. As should be understood, any embodiment may incorporate only one or a plurality of the above-disclosed aspects of the disclosure and may further incorporate only one or a plurality of the above-disclosed features. Furthermore, any embodiment discussed and identified as being "preferred" is considered to be part of a best mode contemplated for carrying out the embodiments of the present disclosure. Other embodiments also may be discussed for additional illustrative purposes in providing a full and enabling disclosure. Moreover, many embodiments, such as adaptations, variations, modifications, and equivalent arrangements, will be implicitly disclosed by the embodiments described herein and fall within the scope of the present disclosure.

Accordingly, while embodiments are described herein in detail in relation to one or more embodiments, it is to be understood that this disclosure is illustrative and exemplary of the present disclosure, and are made merely for the purposes of providing a full and enabling disclosure. The detailed disclosure herein of one or more embodiments is not intended, nor is to be construed, to limit the scope of patent protection afforded in any claim of a patent issuing here from, which scope is to be defined by the claims and the equivalents thereof. It is not intended that the scope of patent protection be defined by reading into any claim limitation found herein and/or issuing here from that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present disclosure.

Accordingly, it is intended that the scope of patent protection is to be defined by the issued claim(s) rather than the description set forth herein.

Additionally, it is important to note that each term used herein refers to that which an ordinary artisan would understand such term to mean based on the contextual use of such term herein. To the extent that the meaning of a term used herein—as understood by the ordinary artisan based on the contextual use of such term—differs in any way from any particular dictionary definition of such term, it is intended that the meaning of the term as understood by the ordinary artisan should prevail.

Furthermore, it is important to note that, as used herein, "a" and "an" each generally denotes "at least one," but does not exclude a plurality unless the contextual use dictates otherwise. When used herein to join a list of items, "or" denotes "at least one of the items," but does not exclude a plurality of items of the list. Finally, when used herein to join a list of items, "and" denotes "all of the items of the list."

The following detailed description refers to the accompanying drawings. Wherever possible, the same reference numbers are used in the drawings and the following description to refer to the same or similar elements. While many embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the claims found herein and/or issuing here from. The present disclosure contains headers. It should be understood that these headers are used as references and are not to be construed as limiting upon the subjected matter disclosed under the header.

The present disclosure includes many aspects and features. Moreover, while many aspects and features relate to, and are described in the context of systems, methods, apparatuses, and devices for facilitating wave-based inversion using Time-Domain Sifrian Inversion (TDSI), embodiments of the present disclosure are not limited to use only in this context.

In general, the method disclosed herein may be performed by one or more computing devices. For example, in some embodiments, the method may be performed by a server computer in communication with one or more client devices over a communication network such as, for example, the Internet. In some other embodiments, the method may be performed by one or more of at least one server computer, at least one client device, at least one network device, at least one sensor, and at least one actuator. Examples of the one or more client devices and/or the server computer may include, a desktop computer, a laptop computer, a tablet computer, a personal digital assistant, a portable electronic device, a wearable computer, a smart phone, an Internet of Things (IoT) device, a smart electrical appliance, a video game console, a rack server, a super-computer, a mainframe computer, mini-computer, micro-computer, a storage server, an application server (e.g., a mail server, a web server, a real-time communication server, an FTP server, a virtual server, a proxy server, a DNS server, etc.), a quantum computer, and so on. Further, one or more client devices and/or the server computer may be configured for executing a software application such as, for example, but not limited to, an operating system (e.g., Windows, Mac OS, Unix, Linux, Android, etc.) in order to provide a user interface (e.g., GUI, touch-screen based interface, voice based interface, gesture based interface, etc.) for use by the one or more users and/or a network interface for communicating with other devices over a communication network. Accordingly, the server computer may include a processing device configured for performing data processing tasks such as, for example, but not limited to, analyzing, identifying, determining, generating, transforming, calculating, computing, compressing, decompressing, encrypting, decrypting, scrambling, splitting, merging, interpolating, extrapolating, redacting, anonymizing, encoding and decoding. Further, the server computer may include a communication device configured for communicating with one or more external devices. The one or more external devices may include, for example, but are not limited to, a client device, a third party database, a public database, a private database, and so on. Further, the communication device may be configured for communicating with the one or more external devices over one or more communication channels. Further, the one or more communication channels may include a wireless communication channel and/or a wired communication channel. Accordingly, the communication device may be configured for performing one or more of transmitting and receiving of information in electronic form. Further, the server computer may include a storage device configured for performing data storage and/or data retrieval operations. In general, the storage device may be configured for providing reliable storage of digital information. Accordingly, in some embodiments, the storage device may be based on technologies such as, but not limited to, data compression, data backup, data redundancy, deduplication, error correction, data fingerprinting, role based access control, and so on.

Further, one or more steps of the method disclosed herein may be initiated, maintained, controlled, and/or terminated based on a control input received from one or more devices operated by one or more users such as, for example, but not limited to, an end user, an admin, a service provider, a service consumer, an agent, a broker and a representative thereof. Further, the user as defined herein may refer to a human, an animal or an artificially intelligent being in any state of existence, unless stated otherwise, elsewhere in the present disclosure. Further, in some embodiments, the one or more users may be required to successfully perform authentication in order for the control input to be effective. In general, a user of the one or more users may perform authentication based on the possession of a secret human readable secret data (e.g., username, password, passphrase, PIN, secret question, secret answer, etc.) and/or possession of a machine readable secret data (e.g., encryption key, decryption key, bar codes, etc.) and/or possession of one or more embodied characteristics unique to the user (e.g., biometric variables such as, but not limited to, fingerprint, palm-print, voice characteristics, behavioral characteristics, facial features, iris pattern, heart rate variability, evoked potentials, brain waves, and so on) and/or possession of a unique device (e.g., a device with a unique physical and/or chemical and/or biological characteristic, a hardware device with a unique serial number, a network device with a unique IP/MAC address, a telephone with a unique phone number, a smartcard with an authentication token stored thereupon, etc.). Accordingly, the one or more steps of the method may include communicating (e.g., transmitting and/or receiving) with one or more sensor devices and/or one or more actuators in order to perform authentication. For example, the one or more steps may include receiving, using the communication device, the secret human readable data from an input device such as, for example, a keyboard, a keypad, a touch-screen, a microphone, a camera, and so on. Likewise, the one or more steps may include receiving, using the communication device, the one or more embodied characteristics from the one or more biometric sensors.

Further, one or more steps of the method may be automatically initiated, maintained, and/or terminated based on one or more predefined conditions. In an instance, the one or more predefined conditions may be based on one or more contextual variables. In general, the one or more contextual variables may represent a condition relevant to the performance of the one or more steps of the method. The one or more contextual variables may include, for example, but are not limited to, location, time, identity of a user associated with a device (e.g., the server computer, a client device, etc.) corresponding to the performance of the one or more steps, environmental variables (e.g., temperature, humidity, pressure, wind speed, lighting, sound, etc.) associated with a device corresponding to the performance of the one or more steps, physical state and/or physiological state and/or psychological state of the user, physical state (e.g., motion, direction of motion, orientation, speed, velocity, acceleration, trajectory, etc.) of the device corresponding to the performance of the one or more steps and/or semantic content of data associated with the one or more users. Accordingly, the one or more steps may include communicating with one or more sensors and/or one or more actuators associated with the one or more contextual variables. For example, the one or more sensors may include, but are not limited to, a timing device (e.g., a real-time clock), a location sensor (e.g., a GPS receiver, a GLONASS receiver, an indoor location sensor, etc.), a biometric sensor (e.g., a fingerprint sensor), an environmental variable sensor (e.g., temperature sensor, humidity sensor, pressure sensor, etc.) and a device state sensor (e.g., a power sensor, a voltage/current sensor, a switch-state sensor, a usage sensor, etc. associated with the device corresponding to performance of the or more steps).

Further, the one or more steps of the method may be performed one or more number of times. Additionally, the one or more steps may be performed in any order other than as exemplarily disclosed herein, unless explicitly stated otherwise, elsewhere in the present disclosure. Further, two or more steps of the one or more steps may, in some embodiments, be simultaneously performed, at least in part. Further, in some embodiments, there may be one or more time gaps between performance of any two steps of the one or more steps.

Further, in some embodiments, the one or more predefined conditions may be specified by the one or more users. Accordingly, the one or more steps may include receiving, using the communication device, the one or more predefined conditions from one or more devices operated by the one or more users. Further, the one or more predefined conditions may be stored in the storage device. Alternatively, and/or additionally, in some embodiments, the one or more predefined conditions may be automatically determined, using the processing device, based on historical data corresponding to performance of the one or more steps. For example, the historical data may be collected, using the storage device, from a plurality of instances of performance of the method. Such historical data may include performance actions (e.g., initiating, maintaining, interrupting, terminating, etc.) of the one or more steps and/or the one or more contextual variables associated therewith. Further, machine learning may be performed on the historical data in order to determine the one or more predefined conditions. For instance, machine learning on the historical data may determine a correlation between one or more contextual variables and performance of the one or more steps of the method. Accordingly, the one or more predefined conditions may be generated, using the processing device, based on the correlation.

Further, one or more steps of the method may be performed at one or more spatial locations. For instance, the method may be performed by a plurality of devices interconnected through a communication network. Accordingly, in an example, one or more steps of the method may be performed by a server computer. Similarly, one or more steps of the method may be performed by a client computer. Likewise, one or more steps of the method may be performed by an intermediate entity such as, for example, a proxy server. For instance, one or more steps of the method may be performed in a distributed fashion across the plurality of devices in order to meet one or more objectives. For example, one objective may be to provide load balancing between two or more devices. Another objective may be to restrict a location of one or more of an input data, an output data, and any intermediate data therebetween corresponding to one or more steps of the method. For example, in a client-server environment, sensitive data corresponding to a user may not be allowed to be transmitted to the server computer. Accordingly, one or more steps of the method operating on the sensitive data and/or a derivative thereof may be performed at the client device.

Overview

The present disclosure describes systems, methods, apparatuses, and devices for facilitating wave-based inversion using Time-Domain Sifrian Inversion (TDSI).

Further, the present disclosure describes the Time-Domain Sifrian Inversion for Optimized Second-Order Imaging and Model Building with Cycle-Skipping Mitigation.

Further, the Time-Domain Sifrian Inversion (TDSI) extends the foundational principles of Sifrian inversion, traditionally applied in the frequency domain, to the time domain. The time domain offers several advantages, including enhanced temporal resolution and the capability for parallel processing. The time domain is particularly well suited for addressing challenges like cycle skipping, as it allows access to the signal envelope and enables the use of sophisticated distance metrics derived from Optimal Transport theory, such as Wasserstein distances. The Time-Domain Sifrian Inversion (TDSI) represents a groundbreaking adaptation of the Sifrian inversion to the time domain. It not only provides a time-domain formulation of the Sifrian inversion but also addresses the cycle-skipping issue through the use of suitable cost functions. The focus of TDSI is on enhancing imaging clarity, precision, and computational efficiency.

Introduced by Mehouachi et al. in 2023, the Sifrian inversion offers an innovative approach to second-order optimization in waveform imaging. It employs a unique mathematical construct known as the Sifrian functional, which intriguingly remains at zero value. The name "Sifrian" is derived from the Arabic word "Sifr," which means zero. This zero-valued functional allows for the efficient incorporation of second-order derivative information into the optimization process, effectively bypassing the computational burden associated with the Hessian matrix.

Further, the extension of the foundational principles of Sifrian inversion allows TDSI to be compatible with existing cost functions that are robust to cycle skipping, a frequent challenge in waveform inversion when low frequencies are absent. TDSI aims to enhance both temporal resolution and imaging accuracy. In terms of computational efficiency, TDSI has the potential to reduce the parameter search space, with the number of time steps serving as an upper limit. By balancing mathematical rigor with computational practicality, TDSI is well suited for a variety of applications, including but not limited to geophysics, seismology, and medical imaging. TDSI aims to establish new benchmarks that evaluate the robustness of imaging techniques in the presence of cycle skipping.

Further, the present disclosure describing the Time-Domain Sifrian Inversion pertains to the domain of Partial Differential Equation (PDE)-constrained optimization, with a special focus on wave phenomena optimization. The Time-Domain Sifrian Inversion (TDSI) is a computational approach that extends the foundational principles of the Sifrian inversion applied exclusively in the frequency domain. TDSI represents a significant advancement in the field, offering an accurate and efficient second-order optimization method that is robust to cycle skipping which is a challenge often encountered in waveform inversion, especially when low frequencies are missing. This novel approach is particularly well suited for applications in geophysics, medical imaging, and other scientific disciplines requiring high-quality imaging. By leveraging the Sifrian functional which is a Lagrangian-like function successful in the frequency domain, the TDSI introduces its time-domain counterparts to address the limitations of cycle-skipping resolution more effectively. In doing so, TDSI establishes new benchmarks in imaging techniques, harmonizing mathematical rigor with computational practicality.

Further, the present disclosure describes a method for Time-Domain Waveform Imaging. Further, the method for the Time-Domain Waveform Imaging is a method for waveform imaging in the time domain. Further, the method may be associated with a computing system that receives observed data from a surveyed medium via one or preferably multiple sensors. This system then generates a model or an image of the surveyed medium. The generation process involves obtaining an initial model, producing synthetic data using this model, and comparing the synthetic data to the observed data. If the observed and synthetic data do not correspond within a predefined matching threshold, the model undergoes iterative updates using the Time-Domain Sifrian Inversion (TDSI) until a match is achieved. This iterative updating is derived from the augmentation of a wavefield equation, an adjoint wavefield, and a gradient definition of the model by introducing specific augmentation variables. Notably, a cost function, which quantifies discrepancies between the synthetic and observed data, is strictly excluded, during the process. The TDSI assembles the augmented components to create a unique functional in the time-domain, followed by a variational perturbation to characterize the update. The formulated updated is better expressed in a sequence of tensors multiplication, addition, and inversion. The final model or image of the surveyed medium is then generated based on the iterative outputs from the TDSI method.

Further, the present disclosure describes a device for Time-Domain Waveform Imaging. Further, the device for the Time-Domain Waveform Imaging is a device designed for waveform imaging and model construction in the time domain. This device comprises an interface and a data processing unit. The interface accommodates both an initial model and observed data from a surveyed medium. The data processing unit, connected to the interface, is designed to produce synthetic data, compare it with observed data, and determine if they match within a set threshold. If not, the unit employs the TDSI to iteratively refine the initial model until a match is achieved. This iterative process leverages the unique properties of the TDSI to ensure accurate and efficient model updates. The data processing unit then outputs the refined model or image of the surveyed medium.

Further, the present disclosure describes a Time-Domain Waveform Imaging Procedure. Further, the Time-Domain Waveform Imaging Procedure is a comprehensive method for waveform imaging and model development in the time domain. This method starts by collecting observed data from a surveyed medium using multiple sensors. An initial model is selected, either from expert guesses, previous modeling, or other methods like tomography that provide long-wavelength information. This initial model is injected into the training loop, and synthetic data derived from this model is produced. The core of the method involves the iterative refinement of the model using TDSI until the synthetic data aligns with the observed data within a set threshold. One of the key advantages of TDSI over its frequency-domain counterpart is its compatibility with cost functions that are robust to cycle skipping. TDSI's unique approach to augmenting and assembling various components of the model ensures efficient leverage of the curvature in the time domain. The method is particularly effective for high-resolution imaging and offers fast convergence, potentially aiding in the identification of objects or areas suitable for further exploration or investigation.

Further, the present disclosure describes the mathematical and computational aspects integral to this disclosure. Further, the present disclosure describes the state-of-the-art methods for gradient computation in waveform inversion specifically an adjoint method which is a technique that is pivotal for efficient optimization and is analogous to backpropagation in machine learning. Further, the present disclosure describes the novelty and utility of the Time-Domain Sifrian Inversion (TDSI) which is an innovative approach to second-order optimization in waveform imaging and model building in the time domain.

Further, the present disclosure describes the Differentials Convention used in this disclosure. Further, the tensor convention is adopted for partial derivatives and represented as $\partial J/\partial m$. Here, J is the function undergoing differentiation, while m denotes the variable with respect to which differentiation occurs. If J is scalar, the resultant $\partial J/\partial m$ will have the same dimensions of m, be it scalar, vector, or a higher-order tensor. If J is tensorial, the resultant tensor $\partial J/\partial m$ will have a rank equal to the sum of the tensor ranks of both J and m, with m contributing its dimensions first. This notation ensures consistency and clarity across all mathematical formulations.

Further, the present disclosure describes Inner Product in Time-Space Functions. In the mathematical framework of waveform inversion, the inner product plays a pivotal role. To better illustrate the ideas, the following canonical inner product is considered as an example: for two finite-energy $\mathcal{L}^2$ functions $f(t, x)$ and $g(t, x)$ defined over a spatial domain $\Omega$ and time interval $[0, T]$, the $\mathcal{L}^2$ inner product is given by:

$$\langle f, g \rangle = \int_0^T \int_\Omega f(t, x) g(t, x) dx dt$$

This inner product captures the "similarity" between two functions across both space and time, providing a mechanism to quantify their alignment or misalignment. The functional space could be generalized with various types of functions and inner products. The inner product could be defined only on the space domain, without time integration, in such case it is denoted as $\langle , \rangle_\Omega$.

Further, the present disclosure describes The Concept of Adjoint Operators. At the heart of many formulations in waveform inversion is the concept of the adjoint operator. Given an operator L, its adjoint L* is defined such that for any two suitable functions $f$ and $g$:

$$\langle Lf, g \rangle = \langle f, L^*g \rangle$$

In essence, the adjoint of an operator captures the "dual" action of the original operator, facilitating the transfer of operations from one function to another within the inner product.

Further, the present disclosure describes Gradient Computation Using the Adjoint Method. The gradient of the cost function, pivotal for optimization, usually requires the computation of a Jacobian matrix which can be computationally expensive. Fortunately, there is an efficient way (adjoint method) to compute the gradient which bypasses the computation of the Jacobian and is derived using both the forward and adjoint equations. Here is a structured overview of the gradient computation process:

1. Forward Modeling (in Time): Given a model parameter set m and a source term q(t, x), the forward problem $\mathcal{F}$ computes the state u(t, x), over a specified time interval [0, T]. Mathematically, this is represented as:

$\mathcal{F}(m(x), u(t,x), q(t,x)) = L(m)u(t,x) + q(t,x) = 0$

The forward operator is linear in u and is represented by an operator L(m) to emphasis the linearity.

2. Misfit Quantification: The misfit between the predicted state u(t, x) and the observed data d(t, x) is encapsulated in the objective function J(m). A prevalent choice for this function is the least-squares formulation:

$$J(m) = \langle R(u-d), R(u-d) \rangle = \int_0^T \int_\Omega R(x)|u(t,x) - d(t,x)|^2 dt dx$$

The R (x) is the spatial sampling operator and it indicates the location of the sensors in the space $\Omega$. Such an operator is needed because data is collected using a finite number of sensors and it is essentially a sum of Dirac functions, which when discretized would correspond to a matrix of ones and zeros, (one indicates the presence of a sensor).

3. Lagrangian: To compute the gradient $\nabla_m J$, an adjoint state $\lambda = \lambda(t, x)$ is introduced within the following Lagrangian:

$\mathcal{L}(m, u, v) = \langle L(m)u + q, \lambda \rangle + J(m, u)$

The adjoint $\lambda$ can have any value, and a value that is selected simplifies the gradient computation.

4. Lagrangian Differentiation and Gradient Computation: Differentiation of the Lagrangian with respect to the model parameters m yields:

$$\frac{d\mathcal{L}}{dm} = \frac{\partial \mathcal{L}}{\partial m} + \frac{du}{dm}\frac{\partial \mathcal{L}}{\partial u}$$

If the wavefield u(t, x) verifies the forward equation, then the first part of the Lagrangian is null and $$\nabla_m J = \frac{d\mathcal{L}}{dm}.$$

The adjoint $\lambda(t, x)$ need to be picked such that $$\frac{\partial \mathcal{L}}{\partial u} = 0,$$

in order to avoid computing the Jacobian du/dm. These considerations yield the following adjoint equation and gradient expression:

$$\begin{cases} \frac{\partial \mathcal{L}}{\partial u} = L^*\lambda + \frac{\partial J}{\partial u} = 0, \\ \nabla_m J = \frac{\partial \mathcal{L}}{\partial m} = \int_0^T \frac{\partial L}{\partial m} \lambda(t,x) dt \end{cases}$$

The gradient of the objective function, crucial for optimization, is determined using both the forward state u(t, x) and the adjoint state $\lambda(t, x)$. This gradient steers optimization algorithms, facilitating iterative model refinements.

Further, the present disclosure describes Spatial Adjoint Operators. To utilize adjoint operators effectively in inversion tasks, it is crucial to understand their properties, particularly in the context of the inner product, which serves as a cornerstone for these operations. In wave propagation scenarios, the Sommerfeld radiation condition is often invoked. This condition stipulates that radiated wavefields diminish to zero at great distances (ideally, at infinity) from the source. In the realm of wave equations, the primary spatial operators of interest are the nabla operator ($\nabla$) and the Laplacian ($\Delta$). When the Sommerfeld radiation condition is applied, integration by parts reveals the following adjoint relationships for these operators:

$$\begin{cases} \nabla^* = -\nabla, \\ \Delta^* = \Delta \end{cases},$$

Further, the present disclosure describes Time Adjoint Operators. For wave equations, the time operators are essentially first and second order derivatives. Similar to the space operator, applying integration by part in the inner product is straightforward, however, it creates boundary values at t=0 and t=T. Given a time axis, and a force/excitation/source applied at time t=0, the nullity of the forward wavefields and their derivatives are assumed at t=0, i.e., u(t=0, x)=0, $\partial_t u(t=0, x)=0$. For any adjoint wavefield and to express easily the adjoints it needs to be explicitly assumed that at t=T, $\lambda(t=T, x)=0$, $\partial_t \lambda(t=T, x)=0$. With this assumption, the following adjoints are obtained:

$$\begin{cases} \left(\frac{\partial}{\partial t}\right)^* = -\frac{\partial}{\partial t} \\ \left(\frac{\partial^2}{\partial t^2}\right)^* = \frac{\partial^2}{\partial t^2} \end{cases},$$

Having a null boundary condition at t=T, induces time reversal as the resolution of any partial differential equation for an adjoint wavefield is performed with a change of variable $\tau = T - t$.

Further, the present disclosure describes an Example Wave Equation which is an illustrative example of the following basic wave equation:

$$m\frac{\partial^2}{\partial t^2}u - \triangle u + q = 0, \text{ with } \forall\, x \in \Omega : u(t=0, x) = \partial_t u(t=0, x) = 0$$

The adjoint wavefield verifies the same equation but with boundary conditions on the final time:

$$m\frac{\partial^2}{\partial t^2}\lambda - \triangle\lambda + \frac{\partial J}{\partial u} = 0, \text{ with } \forall\, x \in \Omega, \lambda(t=T, x) = \partial_t\lambda(t=T, x) = 0$$

The gradient is given by:

$$G = \nabla_m J = \int_0^T \frac{\partial^2 u(t,x)}{\partial t^2}\lambda(t,x)dt$$

Further, the present disclosure describes Efficiency and Practical Considerations. By introducing the concept of the inner product and defining the adjoint within the framework of the adjoint method, the underpinnings of the gradient computation process are better understood. The inner product provides a mechanism to quantify the "similarity" between functions, while the adjoint facilitates efficient gradient computation.

The appeal of the gradient-based optimization approach lies in its computational efficiency. It computes the gradient at a cost comparable to a single forward and backward propagation, irrespective of model parameter count. This scalability renders it apt for large-scale inverse problems. However, the direct application of this approach to second-order optimization presents challenges. These challenges have been addressed in the frequency domain through the Sifrian inversion method. Further, the present disclosure describes the development of the Sifrian inversion to the time domain and offers enhanced compatibility with methods for mitigating cycle-skipping issues.

Further, the present disclosure describes encompasses systems, methods, and computer-readable media related to Time-Domain Sifrian Inversion (TDSI) for wave-based imaging, inversion, and optimization. TDSI adapts the Sifrian functional which is originally conceived for frequency domain applications, to address challenges such as cycle skipping in the time domain. This adaptation allows for the use of time-oriented cost functions that are robust to the challenges of cycle skipping. The method uniquely characterizes the Newton direction for optimization without the computational burden of directly involving the Hessian matrix. This innovation enables more efficient and robust model updates, addressing the slow convergence often associated with traditional optimization techniques.

Further, the present disclosure describes a method for wave-based inversion in the time domain. This method involves collecting wave-based data like seismic or electromagnetic signals, initializing model parameters (e.g., velocity or resistivity models), and iteratively refining these models. The TDSI framework guides this iterative process, incorporating robust cost functions that are resilient to cycle skipping and leveraging second-order updates for enhanced efficiency and robustness.

Further, the present disclosure describes a computing system designed for wave-based inversion. This system receives wave-based data and initiates the inversion process, which includes parameter initialization to prevent null updates. Utilizing the Sifrian functional, the system effectively characterizes the second-order Newton direction, thereby optimizing the inversion process. While the use of a cycle-skipping robust cost function is optional, it is highly recommended. The TDSI framework offers a streamlined and efficient solution that capitalizes on second-order curvature information and provides a time-based remedy for cycle skipping. The system iteratively refines the model until the predicted data aligns with the desired output within a predetermined tolerance level.

Further, the present disclosure describes a wave-based data inversion apparatus consisting of an interface and a data processing unit. The interface is designed to receive, store, and manage datasets essential for the inversion process. The data processing unit, which is interconnected with the interface, supervises the model updating routine and handles necessary synchronization. It generates predictive data by propagating an input sample through the inversion model and employs a predetermined loss function that is robust to cycle skipping to evaluate the difference between the predicted and desired outputs. If this difference exceeds a predefined threshold, the data processing unit triggers further model updates. Utilizing the TDSI framework, the unit iteratively refines the model until the predicted data closely matches the desired output. The data processing unit is also equipped with a specialized solver for executing TDSI updates, thereby optimizing the model to minimize discrepancies between predicted and actual data.

Further, the Sifrian functional which is designed for frequency-domain applications, has been adapted to the time domain. The frequency-domain version operates on individual frequencies, limiting its efficacy in managing cycle skipping. To mitigate cycle skipping, techniques like signal envelopes or Wasserstein distances often require a time-domain formulation. To this end, the time-domain Sifrian functional is introduced as follows:

$$S(m, u, \lambda, \gamma, \zeta, G, N) =$$
$$\langle L(m)u + q, \gamma \rangle + \left\langle L^*(m)\lambda + \frac{\partial J}{\partial u}, \zeta \right\rangle + \left\langle G - \int_0^T \lambda\frac{\partial^2}{\partial t^2}u, N \right\rangle$$

This functional serves as a Lagrangian-like entity, becoming null when the system reaches equilibrium. It integrates both forward and backward equations in the time domain, as well as the gradient definition. Unlike traditional Lagrangian, the Sifrian functional and its derivatives become null when equilibrium conditions for forward, backward, and gradient definitions are met. The term "Sifrian" originates from the Arabic word for zero, "Sifr."

The time-domain Sifrian introduces three new adjoint variables, denoted as ($\gamma$, $\zeta$, N). These variables are pivotal for characterizing the Newton direction. Specifically, ($\gamma$) and ($\zeta$) are second-order multipliers associated with the forward and backward wavefield equations, while (N) is linked to the gradient definition. Further, the present disclosure provides a demonstration that (N) serves as the Newton direction, and ($\zeta$) and ($\gamma$) are perturbations in the forward and backward wavefields induced by the model perturbation through the Newton update (N).

$$\frac{dS}{dm} = \frac{\partial S}{\partial m} + \frac{du}{dm}\frac{\partial S}{\partial u} + \frac{d\lambda}{dm}\frac{\partial S}{\partial \lambda} + \frac{dG}{dm}\frac{\partial S}{\partial G} = 0$$

Upon making the choices:

$$\begin{cases} \frac{\partial S}{\partial u} = 0, \\ \frac{\partial S}{\partial \lambda} = 0, \\ \frac{\partial S}{\partial m} = -G \end{cases}$$

It has been found that $$\frac{\partial S}{\partial G} = N,$$

which corresponds to the Newton direction.

Differentiating the Sifrian functional in the time domain yields the following system of equations:

$$\begin{cases} L^*\gamma + \left(\frac{\partial^2 J}{\partial u^2}\right)^* \zeta - \frac{\partial^2 \lambda}{\partial t^2} N = 0, \\ L\zeta - \frac{\partial^2 u}{\partial t^2} N = 0, \\ \int_0^T \frac{\partial^2 u}{\partial t^2}\gamma + \int_0^T \frac{\partial^2 \lambda}{\partial t^2}\zeta = -\int_0^T \frac{\partial^2 u}{\partial t^2}\lambda \end{cases}$$

Further, differentiating the time-domain Sifrian functional yields a system of equations that is inherently non-convex and challenging to solve. While Gauss-Newton truncation is one approach, the analysis indicates that the Newton method, derived from a Taylor expansion of the gradient, lacks proper truncation. To address this, additional quadratic terms are introduced for formulating an enhanced Sifrian system of equations which are better suited for resolution.

Further differentiation reveals that certain terms are absent from the original formulation. These missing terms are essential for achieving a more accurate and efficient inversion process. The Newton method aims to find an update that nullifies the gradient, as expressed below:

$$G(m-N) = \int_0^T (\lambda + \delta\lambda)\frac{\partial^2 (u + \delta u)}{\partial t^2} = 0$$

Upon analyzing the Sifrian equations, it has been found that the new adjoint variables, $\zeta$ and $\gamma$ are essentially perturbations in the wavefields introduced by the Newton update N.

$$\begin{cases} \zeta = \delta u(-N) \\ \gamma = \delta \lambda(-N) \end{cases},$$

Taking these aspects into account, the full Sifrian system, now incorporating the quadratic terms, is given by:

$$\begin{cases} L^*(\lambda + \gamma) + \left(\frac{\partial^2 J}{\partial u^2}\right)^* \zeta + \frac{\partial J}{\partial u} - \frac{\partial^2 (\lambda + \gamma)}{\partial t^2} N = 0, \\ L\zeta - \frac{\partial^2 u}{\partial t^2} N = 0, \\ \int_0^T (\lambda + \gamma)\frac{\partial^2 (u + \zeta)}{\partial t^2} = 0 \end{cases}$$

The enhanced Sifrian system is convex quadratic and better suited for resolution. The Gauss-Newton system is the linear approximation of the full Sifrian system, when $(\lambda+\gamma)$ is assumed to be small. Instead of linearizing (Gauss-Newton), solving the full Sifrian system is opted for.

One approach to ensure that the perturbed gradient is null involves selecting the Newton update such that $(\lambda+\gamma)$ becomes null. Nullifying $(u+\zeta)$, implies the absence of a forward wavefield which is not desirable. However, nullifying the adjoint is suitable, as it indicates that the mismatches have been eliminated-ultimately the objective of the entire optimization process.

With the perturbed adjoint nullified, two equations remain to be solved:

$$\begin{cases} \left(\frac{\partial^2 J}{\partial u^2}\right)^* \zeta + \frac{\partial J}{\partial u} = 0, \\ L\zeta - \frac{\partial^2 u}{\partial t^2} N = 0 \end{cases}$$

The first equation presents a challenge: the derivatives of the cost function involve the receiver's sampling operator, localizing the information about $\zeta$ at the sensors. This is not ideal for gaining insights into the entire subsurface. However, these equations are computationally efficient and can be interpreted as identifying a suitable perturbation that leads to a second-order update at the receivers. The reduced Sifrian equations are notably streamlined.

To solve these equations, the properties of the adjoint are employed once more. The Lagrange multiplier $\lambda(t, x)$ and a Dirac function $\delta_t$ are introduced to achieve time localization. Formally:

$$\langle L(m)\zeta(t, x)\delta_t, \lambda(t, x)\rangle = \left\langle \frac{\partial^2 u(t, x)}{\partial t^2}N(x)\delta_t, \lambda(t, x)\right\rangle g(t, x) = \lambda\frac{\partial^2 u}{\partial t^2},$$

is introduced which serves as an instantaneous gradient.

$$G(x) = \int_0^T g(t, x)dt$$

By leveraging both the gradient and the Dirac function, and using also the adjoint equation, the following equation is achieved:

$$-\left\langle \zeta, \frac{\partial J}{\partial u} \right\rangle_\Omega = \langle N(x), g(t, x)\rangle_\Omega$$

The differential $\partial_J/\partial_u$ is localized so it could be inverted for $\zeta$ inside the space-only inner product $\langle . \rangle_\Omega$ This leads to the Sifr equation:

$$\left\langle \frac{\partial J}{\partial u}, \left(\frac{\partial^2 J}{\partial u^2}\right)^{-1} \frac{\partial J}{\partial u} \right\rangle_\Omega = \langle N(x), g(t,x) \rangle_\Omega \forall\, t \in [0, T]$$

The Sifr equation is in essence a regularization of the Sifrian system combined with a dimensionality reduction which aims essentially to provide the scaling expected from second-order optimization method.

Solving the Sifr equation can be achieved through discretization in both time and space, thereby converting the system into a rectangular one.

Further, he resolution of the Sifr equation can be approached in multiple ways, but the underlying principle involves discretization in both time and space. Any forward solver that provides the losses and the instantaneous gradient can be employed. The system can be expressed in matrix format as $M_G N=1$, where $M_G$ is a matrix with its first dimension corresponding to $n_t$ the number of time steps, and its second dimension reflecting the size of the model $n_x$. At this juncture, it is worth noting that it is advantageous to consider the Gram matrix $M_G^T M_G$. This significantly reduces the size of the problem, as $n_t$ is typically much smaller than $n_x$. and the inversion would involve a $n_t \times n_t$ matrix. The inversion of this matrix yields the Sifr update.

For extremely large-scale problems where even the computation of the Gram matrix is computationally prohibitive, an ad-hoc conjugate gradient search can be implemented. In this scenario, N can be expressed as $N=M_G^T v$, where v is a vector of size $n_t \times 1$. Damping is an essential component in the inversion process, as is well-known in practice. If the conjugate gradient method is used, the computation of $N=M_G^T v$ can be efficiently performed by modifying the adjoint source terms ∂J/∂u through multiplication along the time axis with the coefficient v.

One of the most important advantages of Time-Domain Sifrian Inversion (TDSI) lies in its robustness against cycle skipping, especially when dealing with absent low frequencies. Unlike its frequency-domain counterpart, TDSI provides a flexible and adaptive framework that accommodates a variety of cycle-skipping-resistant cost functions. These cost functions can be rooted in optimal transport theory, envelope measures, or convolutional measures, thereby offering practitioners a comprehensive toolkit for tackling cycle skipping across diverse applications. This adaptability sets TDSI apart from the original frequency-domain Sifrian method. Furthermore, TDSI can serve as a preliminary step in frequency-domain implementations, effectively mitigating challenges associated with missing frequencies. This dual applicability underscores the innovative nature of TDSI.

In the context of TDSI, it is crucial to note that the second derivative of the cost function with respect to u, denoted as $$\frac{d^2 J}{du^2},$$

is required. Therefore, as long as the norm or distance measure used in the cost function can provide this second derivative, it aligns well with the TDSI framework. This opens the door for incorporating a wide array of distance measures that are robust to cycle skipping, further enhancing the practicality and efficacy of the TDSI approach.

Further, the present disclosure describes a system architecture explicitly designed for implementing the Time-Domain Sifrian Inversion (TDSI). This system comprises a data acquisition unit, a data storage unit, a computational unit, and a user interface. The data acquisition unit is configured to collect oscillatory data from various sensors and instruments, which is then stored in the data storage unit. The computational unit, equipped with high-performance processors and/or GPUs and/or TPU and similar processing specialized devices, is the core of the TDSI implementation. It is programmed to execute the TDSI algorithm, performing iterative model updates based on the Sifrian functional and its resultant Sifr equation, preferably with a one or a combination of robust or non-robust cost function. The computational unit interacts with the data storage unit to fetch the necessary data and to store the inversion results. The user interface optionally allows operators to input initial models, set additional constraints, set optimization parameters, and visualize the inversion results. This integrated system architecture ensures seamless data flow and efficient computation, making TDSI a practical and robust solution for wave-based inversion challenges. The system can be deployed as a standalone unit or integrated into existing data processing pipelines, offering flexibility and scalability to meet various operational needs.

FIG. 1 is an illustration of an online platform 100 consistent with various embodiments of the present disclosure. By way of non-limiting example, the online platform 100 to facilitate wave-based inversion using Time-Domain Sifrian Inversion (TDSI) may be hosted on a centralized server 102, such as, for example, a cloud computing service. The centralized server 102 may communicate with other network entities, such as, for example, a mobile device 106 (such as a smartphone, a laptop, a tablet computer, etc.), other electronic devices 110 (such as desktop computers, server computers, etc.), databases 114, and sensors 116 over a communication network 104, such as, but not limited to, the Internet. Further, users of the online platform 100 may include relevant parties such as, but not limited to, users, administrators, service providers, service consumers, and so on. Accordingly, in some instances, electronic devices operated by the one or more relevant parties may be in communication with the platform.

A user 112, such as the one or more relevant parties, may access online platform 100 through a web based software application or browser. The web based software application may be embodied as, for example, but not be limited to, a website, a web application, a desktop application, and a mobile application compatible with a computing device 1100.

FIG. 2 is a flowchart of a method 200 for facilitating wave-based inversion using Time-Domain Sifrian Inversion (TDSI), in accordance with some embodiments. Further, at 202, the method 200 may include receiving, using a communication device, at least one observed data associated with at least one object from at least one device. Further, the at least one object may include a surveyed medium, an investigated medium, etc. Further, the at least one object may include a geological formation, a human tissue, a subsurface, etc. Further, the at least one device may include a client device. Further, the at least one observed data may include seismic data, electromagnetic data, oscillatory data, etc. Further, the at least one observed data corresponds to at least one task. Further, the at least one task may include subsurface imaging, resource exploration, medical imaging, material investigation, environmental monitoring, etc. Further, the at least one observed data may include data associated with first waves. Further, the at least one observed data may include at least one image of the at least one object.

Further, at 204, the method 200 may include obtaining, using a processing device, at least one initial model associated with the at least one object. Further, the at least one initial model may include a Sigsbee salt model, a BP2004 Salt Model, etc. Further, the at least one initial model may include an initial image. Further, the at least one initial model may include a computational model.

Further, at 206, the method 200 may include obtaining, using the processing device, at least one synthetic data from the at least one initial model. Further, the at least one synthetic data may be predicted data, modeled data, etc. Further, the at least one synthetic data may include data associated with second waves. Further, the first waves and the second waves may be oscillatory waves.

Further, at 208, the method 200 may include determining, using the processing device, a matching of the at least one synthetic data with the at least one observed data is not within a matching threshold. Further, the matching corresponds to aligning the at least one synthetic data with the at least one observed data within a set threshold.

Further, at 210, the method 200 may include updating, using the processing device, the at least one initial model using the Time-Domain Sifrian Inversion (TDSI) iteratively until the matching threshold for the matching may be achieved. Further, the Time-Domain Sifrian Inversion (TDSI) provides an update for the updating of the at least one initial model iteratively using at least one time-domain cost function. Further, the at least one time-domain cost function may be robust to a cycle skipping. Further, the at least one time-domain cost function may be a time-oriented cost function. Further, the at least one time-domain cost function may be associated with squared Wasserstein distance W2. Further, the update may include at least one second-order update. Further, the update may include a Sifr update. Further, the update may include a Newton update. Further, the update may be a Time-Domain Sifrian Inversion (TDSI) update. Further, in an embodiment, the updating of the at least one initial model using the Time-Domain Sifrian Inversion (TDSI) iteratively may include iteratively refining the at least one initial model until a match between the at least one synthetic data and the at least one observed data may be achieved. Further, in an embodiment, the updating of the at least one initial model using the Time-Domain Sifrian Inversion (TDSI) iteratively may include optimizing the at least one initial model. Further, in an embodiment, the updating of the at least one initial model using the Time-Domain Sifrian Inversion (TDSI) iteratively may include implementing a Time-Domain Sifrian Inversion (TDSI) optimizer. Further, the TDSI optimizer performs a parameter update of at least one parameter of the at least one initial model leading to a Sifr update in a time-domain using a time-domain cost function. Further, the TDSI optimizer offers a streamlined and efficient solution that capitalizes on second-order curvature information and provides a time-based remedy for the cycle skipping. Further, the using of the Time-Domain Sifrian Inversion (TDSI) may include implementing a time domain Sifrian functional for the providing of the update. Further, the time domain Sifrian functional may be a Sifrian functional associated with the time domain.

Further, at 212, the method 200 may include generating, using the processing device, at least one final model based on the updating. Further, the at least one final model may include a final image. Further, the at least one final model may include a computational model.

Further, at 214, the method 200 may include storing, using a storage device, the at least one final model.

Further, in some embodiments, the at least one device may include at least one sensor. Further, the at least one sensor may be configured for generating the at least one observed data associated with the at least one object. Further, the at least one sensor may include a plurality of sensors arranged in at least one configuration. Further, the at least one configuration corresponds to a location of each of the plurality of sensors in relation to the at least one object. Further, the at least one sensor may include a waveform sensor. Further, the waveform sensor may be configured for capturing data related to a waveform signal associated with the at least one object. Further, the waveform signal may include mechanical wave signals such as seismic, sound, acoustic, and elastic, or electrical wave signals such as electromagnetic waves. Further, the at least one sensor may include Oscilloscopes, Seismometers, Microphones, Pressure Transducers, Temperature Sensors, etc.

Further, in some embodiments, the updating of the at least one initial model using the Time-Domain Sifrian Inversion (TDSI) may include augmenting at least one of a wavefield equation, an adjoint wavefield, and a gradient definition of the at least one initial model by introducing at least one augmentation variable to at least one of the wavefield equation, the adjoint wavefield, and the gradient definition. Further, the at least one augmentation variable may include at least one adjoint variable. Further, the updating of the at least one initial model using the Time-Domain Sifrian Inversion (TDSI) may include assembling at least one of an augmented wavefield function, an augmented adjoint wavefield, and an augmented gradient definition of the at least one initial model for creating a time domain Sifrian functional based on the augmenting. Further, the Time-Domain Sifrian Inversion (TDSI) provides the update for the updating of the at least one initial model iteratively using the time domain Sifrian functional. Further, the time domain Sifrian functional and at least one derivative of the time domain Sifrian functional become null when equilibrium conditions for forward, backward, and gradient definitions are met.

Further, in an embodiment, the updating of the at least one initial model using the Time-Domain Sifrian Inversion (TDSI) may include performing a variational perturbation for characterizing the update using the time domain Sifrian functional. Further, the Time-Domain Sifrian Inversion (TDSI) provides the update for the updating of the at least one initial model iteratively based on the characterizing of the update.

Further, in an embodiment, the updating of the at least one initial model using the Time-Domain Sifrian Inversion (TDSI) may include characterizing a second-order Newton direction for the updating of the at least one initial model based on the time domain Sifrian functional. Further, the Time-Domain Sifrian Inversion (TDSI) provides the update for the updating of the at least one initial model iteratively based on the characterizing of the second-order Newton direction.

Further, in an embodiment, the time domain Sifrian functional may be:

$$S(m, u, \lambda, \gamma, \zeta, G, N) =$$
$$\langle L(m)u + q, \gamma \rangle + \left\langle L^*(m)\lambda + \frac{\partial J}{\partial u}, \zeta \right\rangle + \left\langle G - \int_0^T \lambda \frac{\partial^2}{\partial t^2} u, N \right\rangle$$

Further, in an embodiment, the updating of the at least one initial model using the Time-Domain Sifrian Inversion (TDSI) may include obtaining at least one Sifrian equation from the time domain Sifrian functional. Further, the at least one Sifrian equation may include a system of equations, an enhanced Sifrian system of equations, etc. Further, the at least one Sifrian equation addresses a non-convexity issue inherent in the wave-based inversion. Further, the Time-Domain Sifrian Inversion (TDSI) provides the update for the updating of the at least one initial model iteratively based on the at least one Sifrian equation. Further, in an embodiment, the at least one Sifrian equation may be:

$$\left\{ \left\langle \frac{\partial J}{\partial u}, \left( \frac{\partial^2 J}{\partial u^2} \right)^{-1} \frac{\partial J}{\partial u} \right\rangle_\Omega \right\} = \langle N(x), g(t, x) \rangle_\Omega \forall t \in [0, T]$$

In further embodiments, the method 200 may include initializing, using the processing device, at least one parameter of the at least one initial model based on the obtaining of the at least one initial model. Further, the at least one parameter may include a velocity, a resistivity, etc. Further, the obtaining of the at least one synthetic data may be based on the initializing. Further, the updating of the at least one initial model may include updating the at least one parameter using the Time-Domain Sifrian Inversion (TDSI) iteratively until the matching threshold for the matching may be achieved.

Further, in an embodiment, the updating of the at least one parameter using the Time-Domain Sifrian Inversion (TDSI) iteratively may include employing at least one of a time discretization and a space discretization for reducing a size of a parameter search space. Further, the Time-Domain Sifrian Inversion (TDSI) provides the update for the updating of the at least one initial model iteratively by selecting at least one parameter value for the at least one parameter from the parameter search space.

FIG. 3 is a block diagram of a system 300 for facilitating wave-based inversion using Time-Domain Sifrian Inversion (TDSI), in accordance with some embodiments. Further, the system 300 may include a communication device 302, a processing device 304, and a storage device 306.

Further, the communication device 302 may be configured for receiving at least one observed data associated with at least one object from at least one device 402, a shown in FIG. 4. Further, the communication device 302 may include a communication interface.

Further, the processing device 304 may be communicatively coupled with the communication device 302. Further, the processing device 304 may be configured for obtaining at least one initial model associated with the at least one object. Further, the processing device 304 may be configured for obtaining at least one synthetic data from the at least one initial model. Further, the processing device 304 may be configured for determining a matching of the at least one synthetic data with the at least one observed data is not within a matching threshold. Further, the processing device 304 may be configured for updating the at least one initial model using the Time-Domain Sifrian Inversion (TDSI) iteratively until the matching threshold for the matching may be achieved. Further, the Time-Domain Sifrian Inversion (TDSI) provides an update for the updating of the at least one initial model iteratively using at least one time-domain cost function. Further, the at least one time-domain cost function may be robust to a cycle skipping. Further, the processing device 304 may be configured for generating at least one final model based on the updating. Further, the processing device 304 may include a computational unit, a data processing unit, etc.

Further, the storage device 306 may be communicatively coupled with the processing device 304. Further, the storage device 306 may be configured for storing the at least one final model.

Further, in some embodiments, the at least one device 402 may include at least one sensor 404, as shown in FIG. 4. Further, the at least one sensor 404 may be configured for generating the at least one observed data associated with the at least one object.

Further, in some embodiments, the updating of the at least one initial model using the Time-Domain Sifrian Inversion (TDSI) may include augmenting at least one of a wavefield equation, an adjoint wavefield, and a gradient definition of the at least one initial model by introducing at least one augmentation variable to at least one of the wavefield equation, the adjoint wavefield, and the gradient definition. Further, the updating of the at least one initial model using the Time-Domain Sifrian Inversion (TDSI) may include assembling at least one of an augmented wavefield function, an augmented adjoint wavefield, and an augmented gradient definition of the at least one initial model for creating a time domain Sifrian functional based on the augmenting. Further, the Time-Domain Sifrian Inversion (TDSI) further provides the update for the updating of the at least one initial model iteratively using the time domain Sifrian functional.

Further, in an embodiment, the updating of the at least one initial model using the Time-Domain Sifrian Inversion (TDSI) further may include performing a variational perturbation for characterizing the update using the time domain Sifrian functional. Further, the Time-Domain Sifrian Inversion (TDSI) further provides the update for the updating of the at least one initial model iteratively based on the characterizing of the update.

Further, in an embodiment, the updating of the at least one initial model using the Time-Domain Sifrian Inversion (TDSI) further may include characterizing a second-order Newton direction for the updating of the at least one initial model based on the time domain Sifrian functional. Further, the Time-Domain Sifrian Inversion (TDSI) further provides the update for the updating of the at least one initial model iteratively based on the characterizing of the second-order Newton direction.

Further, in an embodiment, the time domain Sifrian functional may be:

$$S(m, u, \lambda, \gamma, \zeta, G, N) =$$
$$\langle L(m)u + q, \gamma \rangle + \left\langle L^*(m)\lambda + \frac{\partial J}{\partial u}, \zeta \right\rangle + \left\langle G - \int_0^T \lambda \frac{\partial^2}{\partial t^2} u, N \right\rangle$$

Further, in an embodiment, the updating of the at least one initial model using the Time-Domain Sifrian Inversion (TDSI) further may include obtaining at least one Sifrian equation from the time domain Sifrian functional. Further, the at least one Sifrian equation addresses a non-convexity issue inherent in the wave-based inversion. Further, the Time-Domain Sifrian Inversion (TDSI) further provides the update for the updating of the at least one initial model iteratively based on the at least one Sifrian equation. Further, in an embodiment, the at least one Sifrian equation may be:

$$\left\{\frac{\partial J}{\partial u}, \left(\frac{\partial^2 J}{\partial u^2}\right)^{-1} \frac{\partial J}{\partial u}\right\}_\Omega = \langle N(x), g(t, x)\rangle_\Omega \forall\, t \in [0, T]$$

Further, in some embodiments, the processing device 304 may be further configured for initializing at least one parameter of the at least one initial model based on the obtaining of the at least one initial model. Further, the obtaining of the at least one synthetic data may be based on the initializing. Further, the updating of the at least one initial model may include updating the at least one parameter using the Time-Domain Sifrian Inversion (TDSI) iteratively until the matching threshold for the matching may be achieved.

Further, in an embodiment, the updating of the at least one parameter using the Time-Domain Sifrian Inversion (TDSI) iteratively may include employing at least one of a time discretization and a space discretization for reducing a size of a parameter search space. Further, the Time-Domain Sifrian Inversion (TDSI) provides the update for the updating of the at least one initial model iteratively by selecting at least one parameter value for the at least one parameter from the parameter search space.

FIG. 4 is a block diagram of the system 300, in accordance with some embodiments.

FIG. 5 is a graph 500 representing cycle skipping using two oscillatory signals, in accordance with some embodiments. Further, the two oscillatory signals may include a first signal (original curve) and a second signal. Further, the first signal may correspond to an observed signal and the second signal may correspond to a modeled signal. Further, the second signal is shifted by 0.1 period. Further, the second signal when shifted by 0.1 period may exhibit minimal quantified mismatches with the first signal in the graph 500 despite being out of phase by an entire cycle or more and thus representing the cycle skipping.

FIG. 6 is a graph 600 representing the cycle skipping using the two oscillatory signals, in accordance with some embodiments. Further, the second signal when shifted by 1 period may exhibit maximal quantified mismatches with the first signal in the graph 600 and thus represent the cycle skipping. The cycle skipping may be particularly misleading in wave-based inversion methods, as it suggests a false sense of accuracy between observed signals and modeled signals.

FIG. 7 is a graph 700 representing a cost function landscape of a cost function in a context of cycle skipping, in accordance with some embodiments. Further, the cost function landscape may be a L2 cost landscape. Further, the graph 700 represents the cost function landscape of a classic L2 distance-based cost function, between 2D shifted oscillatory signals highlighting the creation of local minima based on the cycle skipping that may potentially trap optimization algorithms.

FIG. 8 is a graph 800 representing a cost function landscape of a cost function in a context of the cycle skipping, in accordance with some embodiments. Further, the cost function landscape may be a Wasserstein-2 cost landscape. Further, the graph 800 represents the cost function landscape when the cost function utilizes squared Wasserstein distance W2. Further, the cost function derived from optimal transport theory, envelope measures, or convolutional measures offers effective solutions in the time domain to the cycle skipping issue, reshaping the cost function landscape into a more stable and useful form for the optimization.

FIG. 9A illustrates a reference model used for evaluating an efficacy of Time-Domain Sifrian Inversion (TDSI) on a BP2004 Salt Model, in accordance with some embodiments. Further, the reference model serves as a ground truth. Further, the reference model may be a colormap indicative of seismic velocity, measured in km/s.

FIG. 9B illustrates an initial model used for the evaluating of the efficacy of the Time-Domain Sifrian Inversion (TDSI) on the BP2004 Salt Model, in accordance with some embodiments. Further, the initial model represents a starting point for the inversion. Further, the initial model may be a colormap indicative of seismic velocity, measured in km/s.

FIG. 9C illustrates an outcome model that is obtained after performing the TDSI with L2 norm using a traditional distance measure, used for the evaluating of the efficacy of the Time-Domain Sifrian Inversion (TDSI) on the BP2004 Salt Model, in accordance with some embodiments. Further, the outcome model corresponds to an inversion result after 300 iterations, focusing on data that has been bandpass-filtered in the 2 to 32 Hz range. Further, the outcome model may be a colormap indicative of seismic velocity, measured in km/s.

FIG. 9D illustrates an outcome model that is obtained after performing Cycle-Skipping Robust TDSI employing squared Wasserstein distance W2, used for the evaluating of the efficacy of the Time-Domain Sifrian Inversion (TDSI) on the BP2004 Salt Model, in accordance with some embodiments. Further, the outcome model corresponds to an inversion result after 300 iterations, focusing on data that has been bandpass-filtered in the 2 to 32 Hz range. Further, the outcome model may be a colormap indicative of seismic velocity, measured in km/s. Further, the outcome model effectively mitigates the cycle-skipping issue through the application of the W2 distance, which is compatible with the novel time domain version of the Sifrian inversion, thereby achieving the most accurate inversion.

FIG. 10A illustrates a reference model used for evaluating an efficacy of Time-Domain Sifrian Inversion (TDSI) on a Sigsbee salt model, in accordance with some embodiments. Further, the reference model serves as a ground truth. Further, the reference model may be a colormap indicative of seismic velocity, measured in km/s.

FIG. 10B illustrates an initial model used for the evaluating of the efficacy of the Time-Domain Sifrian Inversion (TDSI) on the Sigsbee salt model, in accordance with some embodiments. Further, the initial model represents a starting point for the inversion. Further, the initial model may be a colormap indicative of seismic velocity, measured in km/s.

FIG. 10C illustrates an outcome model that is obtained after performing the TDSI with L2 norm using a traditional distance measure, used for the evaluating of the efficacy of the Time-Domain Sifrian Inversion (TDSI) on the Sigsbee salt model, in accordance with some embodiments. Further, the outcome model corresponds to an inversion result after 300 iterations, focusing on data in the 2 to 32 Hz range. Further, the outcome model may be a colormap indicative of seismic velocity, measured in km/s.

FIG. 10D illustrates an outcome model that is obtained after performing Cycle-Skipping Robust TDSI employing squared Wasserstein distance W2, used for the evaluating of the efficacy of the Time-Domain Sifrian Inversion (TDSI) on the Sigsbee salt model, in accordance with some embodiments. Further, the outcome model corresponds to an inversion result after 300 iterations, focusing on data in the 2 to 32 Hz range. Further, the outcome model may be a colormap indicative of seismic velocity, measured in km/s. Further, the outcome model effectively mitigates the cycle-skipping issue through the application of the W2 distance, which is compatible with the novel time domain version of the Sifrian inversion, thereby achieving the most accurate inversion.

With reference to FIG. 11, a system consistent with an embodiment of the disclosure may include a computing device or cloud service, such as computing device 1100. In a basic configuration, computing device 1100 may include at least one processing unit 1102 and a system memory 1104. Depending on the configuration and type of computing device, system memory 1104 may comprise, but is not limited to, volatile (e.g., random-access memory (RAM)), non-volatile (e.g., read-only memory (ROM)), flash memory, or any combination. System memory 1104 may include operating system 1105, one or more programming modules 1106, and may include a program data 1107. Operating system 1105, for example, may be suitable for controlling computing device 1100's operation. In one embodiment, programming modules 1106 may include image-processing module, machine learning module. Furthermore, embodiments of the disclosure may be practiced in conjunction with a graphics library, other operating systems, or any other application program and is not limited to any particular application or system. This basic configuration is illustrated in FIG. 11 by those components within a dashed line 1108.

Computing device 1100 may have additional features or functionality. For example, computing device 1100 may also include additional data storage devices (removable and/or non-removable) such as, for example, magnetic disks, optical disks, or tape. Such additional storage is illustrated in FIG. 11 by a removable storage 1109 and a non-removable storage 1110. Computer storage media may include volatile and non-volatile, removable and non-removable media implemented in any method or technology for storage of information, such as computer-readable instructions, data structures, program modules, or other data. System memory 1104, removable storage 1109, and non-removable storage 1110 are all computer storage media examples (i.e., memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 1100. Any such computer storage media may be part of device 1100. Computing device 1100 may also have input device(s) 1112 such as a keyboard, a mouse, a pen, a sound input device, a touch input device, a location sensor, a camera, a biometric sensor, etc. Output device(s) 1114 such as a display, speakers, a printer, etc. may also be included. The aforementioned devices are examples and others may be used.

Computing device 1100 may also contain a communication connection 1116 that may allow device 1100 to communicate with other computing devices 1118, such as over a network in a distributed computing environment, for example, an intranet or the Internet. Communication connection 1116 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both storage media and communication media.

As stated above, a number of program modules and data files may be stored in system memory 1104, including operating system 1105. While executing on processing unit 1102, programming modules 1106 (e.g., application 1120 such as a media player) may perform processes including, for example, one or more stages of methods, algorithms, systems, applications, servers, databases as described above. The aforementioned process is an example, and processing unit 1102 may perform other processes. Other programming modules that may be used in accordance with embodiments of the present disclosure may include machine learning applications.

Generally, consistent with embodiments of the disclosure, program modules may include routines, programs, components, data structures, and other types of structures that may perform particular tasks or that may implement particular abstract data types. Moreover, embodiments of the disclosure may be practiced with other computer system configurations, including hand-held devices, general purpose graphics processor-based systems, multiprocessor systems, microprocessor-based or programmable consumer electronics, application specific integrated circuit-based electronics, minicomputers, mainframe computers, and the like. Embodiments of the disclosure may also be practiced in distributed computing environments where tasks are performed by remote processing devices that are linked through a communications network. In a distributed computing environment, program modules may be located in both local and remote memory storage devices.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to mechanical, optical, fluidic, and quantum technologies. In addition, embodiments of the disclosure may be practiced within a general-purpose computer or in any other circuits or systems.

Embodiments of the disclosure, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random-access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, solid state storage (e.g., USB drive), or a CD-ROM, a carrier wave from the Internet, or other forms of RAM or ROM. Further, the disclosed methods' stages may be modified in any manner, including by reordering stages and/or inserting or deleting stages, without departing from the disclosure.

According to some aspects, a method for wave-based inversion using Time-Domain Sifrian Inversion (TDSI), is disclosed. Further, the method may include receiving an initial model of a surveyed medium. Further, the method may include implementing the TDSI optimizer that performs parameter updates leading to the Sifr update in the time-domain using a time-domain cost function. Further, the method may include optimizing the model parameters until convergence of the optimization process or a stopping criterion is met.

Further, according to some aspects, the TDSI optimizer mitigates computational complexities associated with second-order optimization by solving for a reduced number of parameters equivalent to the number of time steps or less, irrespective of the model parameter dimensions.

Further, according to some aspects, the TDSI optimizer utilizes cost functions that are robust to cycle skipping, employs the Sifr equation, and uses damping to enhance the conditioning of its inherent system, thereby facilitating more effective model inversion.

Further, according to some aspects, the TDSI optimizer employs time and space discretization to reduce the parameter search space, leading to improved computational efficiency.

Further, according to some aspects, the TDSI optimizer performs the inversion across various wave-based survey architectures, including but not limited to seismic, electromagnetic, and other wave-based surveys.

Further, according to some aspects, the TDSI optimizer accomplishes a rapid reduction in the cost function per iteration while maintaining competitive computational performance.

Further, according to some aspects, the TDSI optimizer enables accelerated convergence and improved fitting in wave-based inversion by considering parameter search with a suitable cost function to create a cycle-skipping robust Sifr update in the time domain.

Further, according to some aspects, the TDSI optimizer effectively performs inversion for surveys with a large number of sensors and parameters, demonstrating its scalability and adaptability to various scales of survey implementations.

Further, according to some aspects, the TDSI optimizer effectively performs inversion for various tasks, including but not limited to subsurface imaging, resource exploration, medical imaging, material investigation, and environmental monitoring.

Further, according to some aspects, the TDSI optimizer effectively performs second-order inversion with various types of data, including but not limited to seismic, electromagnetic, and other oscillatory data, illustrating its versatility across different data types and tasks.

Further, according to some aspects, the TDSI optimizer addresses non-convexity issues that are inherent in waveform inversion methods by including quadratic terms when canceling the gradient, thereby solving the non-convexity issue and further enhancing the inversion process.

Further, according to some aspects, the TDSI optimizer applies theoretical considerations that depart from standard inversion methods, yielding an optimizer that performs second-order updates without the computational complexity of forming the Hessian or its inverse.

Further, according to some aspects, the TDSI optimizer achieves dimensionality reduction during the inversion process by leveraging the differential properties inherent in wave-based phenomena and adjoint wavefields in wave-based surveys.

Further, according to some aspects, the TDSI optimizer effectively optimizes various survey architectures regardless of their size, demonstrating the scalability and versatility of the method.

According to some aspects, a device for wave-based inversion is disclosed. Further, the device is configured with standard components and potentially benefiting from additional resources such as multiple CPUs, GPUs, and extra RAM. Further, the device may include an interface for inputting the initial model of the surveyed medium. Further, the device may include a data processing unit implementing the TDSI optimizer for performing second-order, cycle-skipping robust inversion.

Further, according to some aspects, the TDSI optimizer in the data processing unit characterizes the TDSI update for optimization by reducing the parameter space to a vector of maximum size equivalent to the number of time steps or less.

Further, according to some aspects, the TDSI optimizer in the data processing unit performs second-order updates, accommodating time and space discretization, and reducing dimensionality, leading to an efficient and accurate inversion process.

Further, according to some aspects, the TDSI optimizer in the data processing unit optimizes the inversion across various survey architectures, providing enhanced second-order inversion functionality across different survey designs.

Further, according to some aspects, the data processing unit is configured with specific components and settings to facilitate the implementation of the TDSI optimizer, providing a hardware solution that supports the efficient inversion of oscillatory data in the time domain.

Further, according to some aspects, the TDSI optimizer in the data processing unit can be efficiently implemented on multiple GPUs and with extensive RAM, demonstrating the flexibility of the method with respect to hardware configurations.

Although the present disclosure has been explained in relation to its preferred embodiment, it is to be understood that many other possible modifications and variations can be made without departing from the spirit and scope of the disclosure.

What is claimed is:

1. A method for facilitating wave-based inversion using Time-Domain Sifrian Inversion (TDSI), the method comprising:
receiving, using a communication device, at least one observed data associated with at least one object from at least one device;
obtaining, using a processing device, at least one initial model associated with the at least one object;
obtaining, using the processing device, at least one synthetic data from the at least one initial model;
determining, using the processing device, a matching of the at least one synthetic data with the at least one observed data is not within a matching threshold;
updating, using the processing device, the at least one initial model using the Time-Domain Sifrian Inversion (TDSI) iteratively until the matching threshold for the matching is achieved, wherein the Time-Domain Sifrian Inversion (TDSI) provides an update for the updating of the at least one initial model iteratively using at least one time-domain cost function, wherein the at least one time-domain cost function is robust to a cycle skipping;
generating, using the processing device, at least one final model based on the updating; and
storing, using a storage device, the at least one final model.

2. The method of claim 1, wherein the at least one device comprises at least one sensor, wherein the at least one sensor is configured for generating the at least one observed data associated with the at least one object.

3. The method of claim 1, wherein the updating of the at least one initial model using the Time-Domain Sifrian Inversion (TDSI) comprises:
augmenting at least one of a wavefield equation, an adjoint wavefield, and a gradient definition of the at least one initial model by introducing at least one augmentation variable to at least one of the wavefield equation, the adjoint wavefield, and the gradient definition; and
assembling at least one of an augmented wavefield function, an augmented adjoint wavefield, and an augmented gradient definition of the at least one initial model for creating a time domain Sifrian functional based on the augmenting, wherein the Time-Domain Sifrian Inversion (TDSI) further provides the update for the updating of the at least one initial model iteratively using the time domain Sifrian functional.

4. The method of claim 3, wherein the updating of the at least one initial model using the Time-Domain Sifrian Inversion (TDSI) further comprises performing a variational perturbation for characterizing the update using the time domain Sifrian functional, wherein the Time-Domain Sifrian Inversion (TDSI) further provides the update for the updating of the at least one initial model iteratively based on the characterizing of the update.

5. The method of claim 3, wherein the updating of the at least one initial model using the Time-Domain Sifrian Inversion (TDSI) further comprises characterizing a second-order Newton direction for the updating of the at least one initial model based on the time domain Sifrian functional, wherein the Time-Domain Sifrian Inversion (TDSI) further provides the update for the updating of the at least one initial model iteratively based on the characterizing of the second-order Newton direction.

6. The method of claim 3, wherein the time domain Sifrian functional is:

$$S(m, u, \lambda, \gamma, \zeta, G, N) =$$
$$\langle L(m)u + q, \gamma \rangle + \left\langle L^*(m)\lambda + \frac{\partial J}{\partial u}, \zeta \right\rangle + \left\langle G - \int_0^T \lambda \frac{\partial^2}{\partial c^2} u, N \right\rangle.$$

7. The method of claim 3, wherein the updating of the at least one initial model using the Time-Domain Sifrian Inversion (TDSI) further comprises obtaining at least one Sifrian equation from the time domain Sifrian functional, wherein the at least one Sifrian equation addresses a non-convexity issue inherent in the wave-based inversion, wherein the Time-Domain Sifrian Inversion (TDSI) further provides the update for the updating of the at least one initial model iteratively based on the at least one Sifrian equation.

8. The method of claim 7, wherein the at least one Sifrian equation is:

$$\left\{ \frac{\partial J}{\partial u}, \left( \frac{\partial^2 J}{\partial u^2} \right)^{-1} \frac{\partial J}{\partial u} \right\}_\Omega = \langle N(x), g(t, x) \rangle_\Omega \forall t \in [0, T]$$

9. The method of claim 1 further comprising initializing, using the processing device, at least one parameter of the at least one initial model based on the obtaining of the at least one initial model, wherein the obtaining of the at least one synthetic data is based on the initializing, wherein the updating of the at least one initial model comprises updating the at least one parameter using the Time-Domain Sifrian Inversion (TDSI) iteratively until the matching threshold for the matching is achieved.

10. The method of claim 9, wherein the updating of the at least one parameter using the Time-Domain Sifrian Inversion (TDSI) iteratively further comprises employing at least one of a time discretization and a space discretization for reducing a size of a parameter search space, wherein the Time-Domain Sifrian Inversion (TDSI) provides the update for the updating of the at least one initial model iteratively by selecting at least one parameter value for the at least one parameter from the parameter search space.

11. A system for facilitating wave-based inversion using Time-Domain Sifrian Inversion (TDSI), the system comprising:
a communication device configured for receiving at least one observed data associated with at least one object from at least one device;

a processing device communicatively coupled with the communication device, wherein the processing device is configured for:
  obtaining at least one initial model associated with the at least one object;
  obtaining at least one synthetic data from the at least one initial model;
  determining a matching of the at least one synthetic data with the at least one observed data is not within a matching threshold;
  updating the at least one initial model using the Time-Domain Sifrian Inversion (TDSI) iteratively until the matching threshold for the matching is achieved, wherein the Time-Domain Sifrian Inversion (TDSI) provides an update for the updating of the at least one initial model iteratively using at least one time-domain cost function, wherein the at least one time-domain cost function is robust to a cycle skipping; and
  generating at least one final model based on the updating; and
a storage device communicatively coupled with the processing device, wherein the storage device is configured for storing the at least one final model.

12. The system of claim 11, wherein the at least one device comprises at least one sensor, wherein the at least one sensor is configured for generating the at least one observed data associated with the at least one object.

13. The system of claim 11, wherein the updating of the at least one initial model using the Time-Domain Sifrian Inversion (TDSI) comprises:
  augmenting at least one of a wavefield equation, an adjoint wavefield, and a gradient definition of the at least one initial model by introducing at least one augmentation variable to at least one of the wavefield equation, the adjoint wavefield, and the gradient definition; and
  assembling at least one of an augmented wavefield function, an augmented adjoint wavefield, and an augmented gradient definition of the at least one initial model for creating a time domain Sifrian functional based on the augmenting, wherein the Time-Domain Sifrian Inversion (TDSI) further provides the update for the updating of the at least one initial model iteratively using the time domain Sifrian functional.

14. The system of claim 13, wherein the updating of the at least one initial model using the Time-Domain Sifrian Inversion (TDSI) further comprises performing a variational perturbation for characterizing the update using the time domain Sifrian functional, wherein the Time-Domain Sifrian Inversion (TDSI) further provides the update for the updating of the at least one initial model iteratively based on the characterizing of the update.

15. The system of claim 13, wherein the updating of the at least one initial model using the Time-Domain Sifrian Inversion (TDSI) further comprises characterizing a second-order Newton direction for the updating of the at least one initial model based on the time domain Sifrian functional, wherein the Time-Domain Sifrian Inversion (TDSI) further provides the update for the updating of the at least one initial model iteratively based on the characterizing of the second-order Newton direction.

16. The system of claim 13, wherein the time domain Sifrian functional is:

$$S(m, u, \lambda, \gamma, \zeta, G, N) = \langle L(m)u + q, \gamma \rangle + \left\langle L^*(m)\lambda + \frac{\partial J}{\partial u}, \zeta \right\rangle + \left\langle G - \int_0^T \lambda \frac{\partial^2}{\partial c^2} u, N \right\rangle.$$

17. The system of claim 13, wherein the updating of the at least one initial model using the Time-Domain Sifrian Inversion (TDSI) further comprises obtaining at least one Sifrian equation from the time domain Sifrian functional, wherein the at least one Sifrian equation addresses a non-convexity issue inherent in the wave-based inversion, wherein the Time-Domain Sifrian Inversion (TDSI) further provides the update for the updating of the at least one initial model iteratively based on the at least one Sifrian equation.

18. The system of claim 17, wherein the at least one Sifrian equation is:

$$\left\{ \frac{\partial J}{\partial u}, \left( \frac{\partial^2 J}{\partial u^2} \right)^{-1} \frac{\partial J}{\partial u} \right\}_\Omega = \langle N(x), g(t, x) \rangle_\Omega \forall\, t \in [0, T]$$

19. The system of claim 11, wherein the processing device is further configured for initializing at least one parameter of the at least one initial model based on the obtaining of the at least one initial model, wherein the obtaining of the at least one synthetic data is based on the initializing, wherein the updating of the at least one initial model comprises updating the at least one parameter using the Time-Domain Sifrian Inversion (TDSI) iteratively until the matching threshold for the matching is achieved.

20. The system of claim 19, wherein the updating of the at least one parameter using the Time-Domain Sifrian Inversion (TDSI) iteratively further comprises employing at least one of a time discretization and a space discretization for reducing a size of a parameter search space, wherein the Time-Domain Sifrian Inversion (TDSI) provides the update for the updating of the at least one initial model iteratively by selecting at least one parameter value for the at least one parameter from the parameter search space.

* * * * *